United States Patent
Sedighi et al.

(10) Patent No.: US 9,362,919 B1
(45) Date of Patent: Jun. 7, 2016

(54) DEVICES FOR UTILIZING SYMFETS FOR LOW-POWER INFORMATION PROCESSING

(71) Applicant: University of Notre Dame du Lac, Notre Dame, IN (US)

(72) Inventors: Behnam Sedighi, San Diego, CA (US); Michael Niemier, Granger, IN (US); X. Sharon Hu, Granger, IN (US); Joseph J. Nahas, Austin, TX (US)

(73) Assignee: University of Notre Dame du Lac, Notre Dame, IN (US)

( * ) Notice: Subject to any disclaimer, the term of this patent is extended or adjusted under 35 U.S.C. 154(b) by 0 days.

(21) Appl. No.: 14/579,763

(22) Filed: Dec. 22, 2014

(51) Int. Cl.
*H03K 19/195* (2006.01)
*H01L 29/06* (2006.01)
*H01L 29/16* (2006.01)
*H01L 29/778* (2006.01)
*H01L 29/08* (2006.01)

(52) U.S. Cl.
CPC .......... *H03K 19/195* (2013.01); *H01L 29/0895* (2013.01); *H01L 29/1606* (2013.01); *H01L 29/778* (2013.01)

(58) Field of Classification Search
CPC ..................... H01L 29/1606; H01L 29/66045; H01L 47/00; H01L 29/7311; H01L 29/0847; H01L 29/66477; H01L 29/7376; H03K 19/08; H03K 19/20; H03K 19/0948; H03K 19/23
See application file for complete search history.

(56) References Cited

U.S. PATENT DOCUMENTS

| | | | | |
|---|---|---|---|---|
| 8,263,967 | B1* | 9/2012 | Banerjee | B82Y 10/00 257/36 |
| 9,040,957 | B2* | 5/2015 | Lee | H01L 29/78 257/27 |
| 9,076,873 | B2* | 7/2015 | Chen | H01L 29/4908 |
| 9,197,215 | B1* | 11/2015 | Balandin | H03K 19/20 |
| 2013/0313522 | A1* | 11/2013 | Nourbakhsh | H01L 29/1606 257/29 |
| 2015/0221499 | A1* | 8/2015 | Park | H01L 29/1606 257/29 |

OTHER PUBLICATIONS

Y. Bi, K. Shamsi, P.-E. Gaillardon, G. de Micheli, X. Yin, X. Hu, M. Niemier, J.-S. Yuan, and Y. Jin, "Emerging Technology based Design Primitives for Hardware Security," under review in ACM Journal of Emerging Technologies in Computing Systems, 2014.
B. Sedighi, X. Sharon Hu, Joseph J. Nahas, and Michael Niemier, "Nontraditional Computation Using Beyond-CMOS Tunneling Devices," IEEE Journal on Emerging and Selected Topics in Circuits and Systems, p. 438-449, Dec. 2014.
Y. Bi, P.-E. Gaillardon, X. Hu, M. Niemier, J.-S. Yuan, and Y. Jin, "Leveraging Emerging Technology for Hardware Security—Case Study on Silicon Nanowire FETs and Graphene SymFETs," in IEEE Asia Test Symposium (ATS), 2014, p. 342-347.

* cited by examiner

*Primary Examiner* — Vibol Tan
(74) *Attorney, Agent, or Firm* — Greenberg Traurig, LLP

(57) ABSTRACT

A Boolean gate includes at least one symmetric tunneling field-effect transistor (SymFET) for low-power information processing. SymFETs are ideal for applications that demand low power and have moderate speed requirements, and demonstrate better dynamic energy efficiency than CMOS circuits. Negative differential resistance (NDR) behavior of SymFETs leads to hysteresis in inverters and buffers, and can be used to build simple Schmitt-triggers. Further, pseudo-SymFET loads may be utilized in circuits similar to all-n-type or dynamic logic. For example, latches and flip-flops as well as NAND, NOR, IMPLY, and MAJORITY gates may employ SymFETs. Such SymFET-based devices require fewer transistors than static CMOS-based designs.

13 Claims, 38 Drawing Sheets

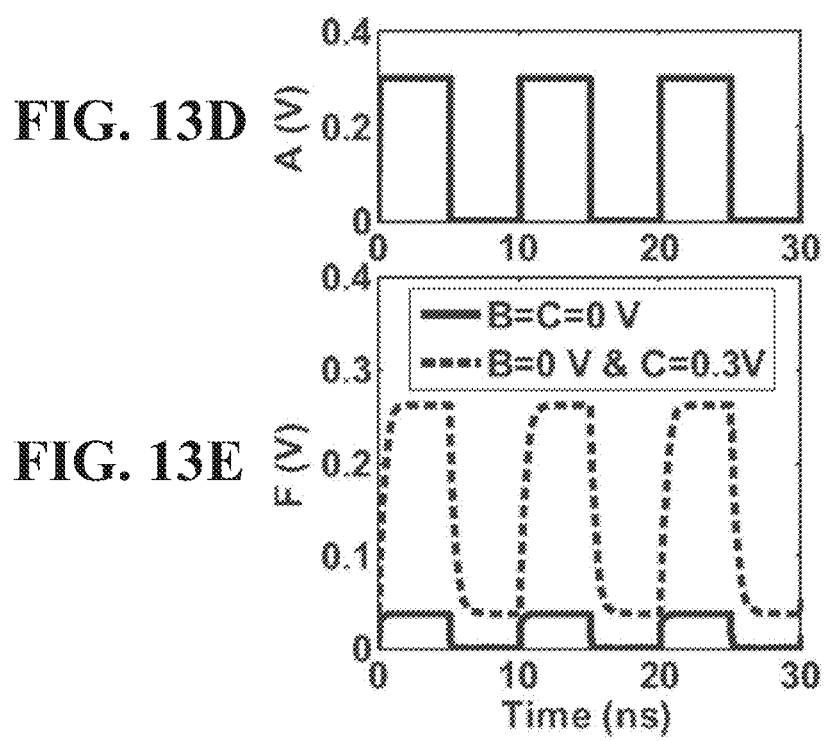

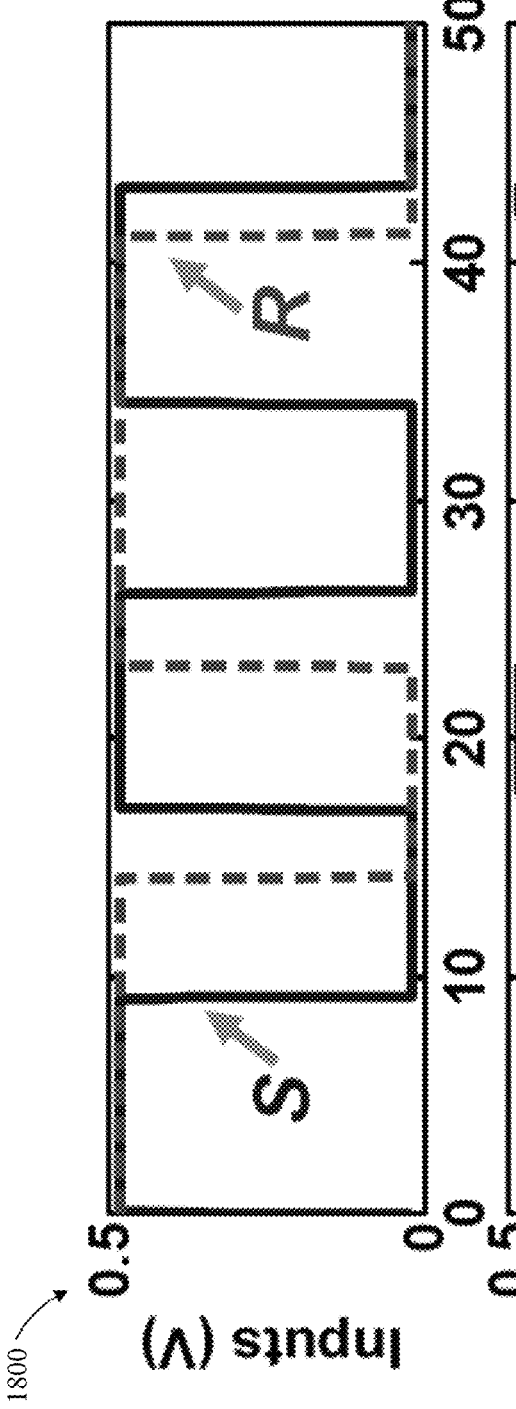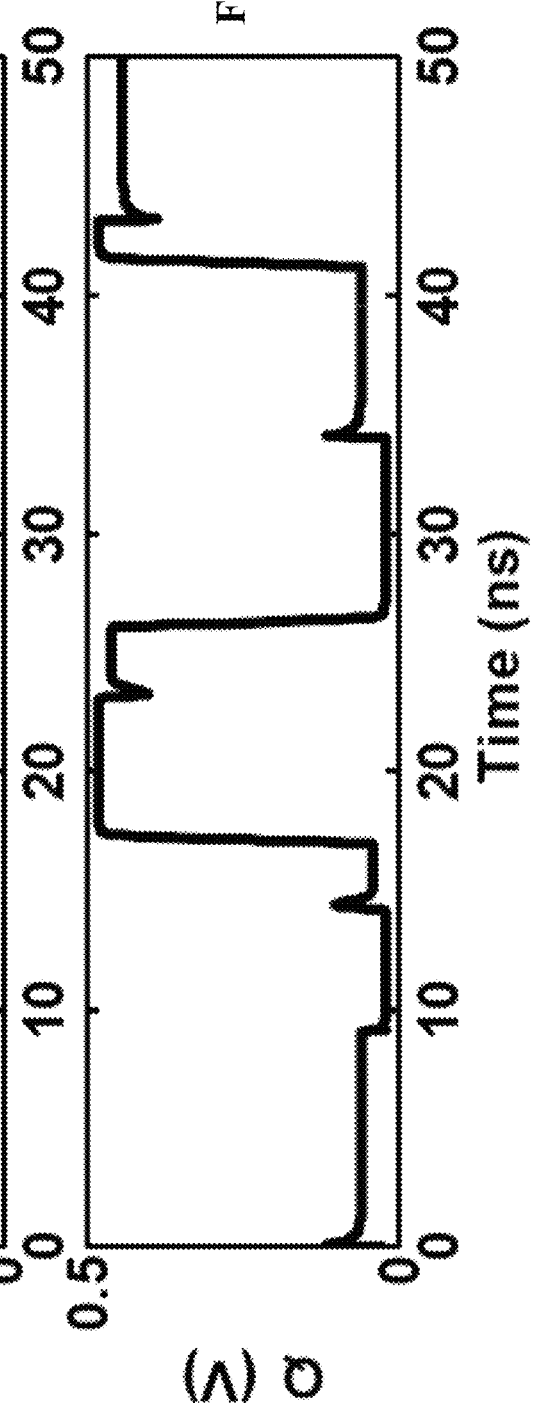
FIG. 18A
FIG. 18B

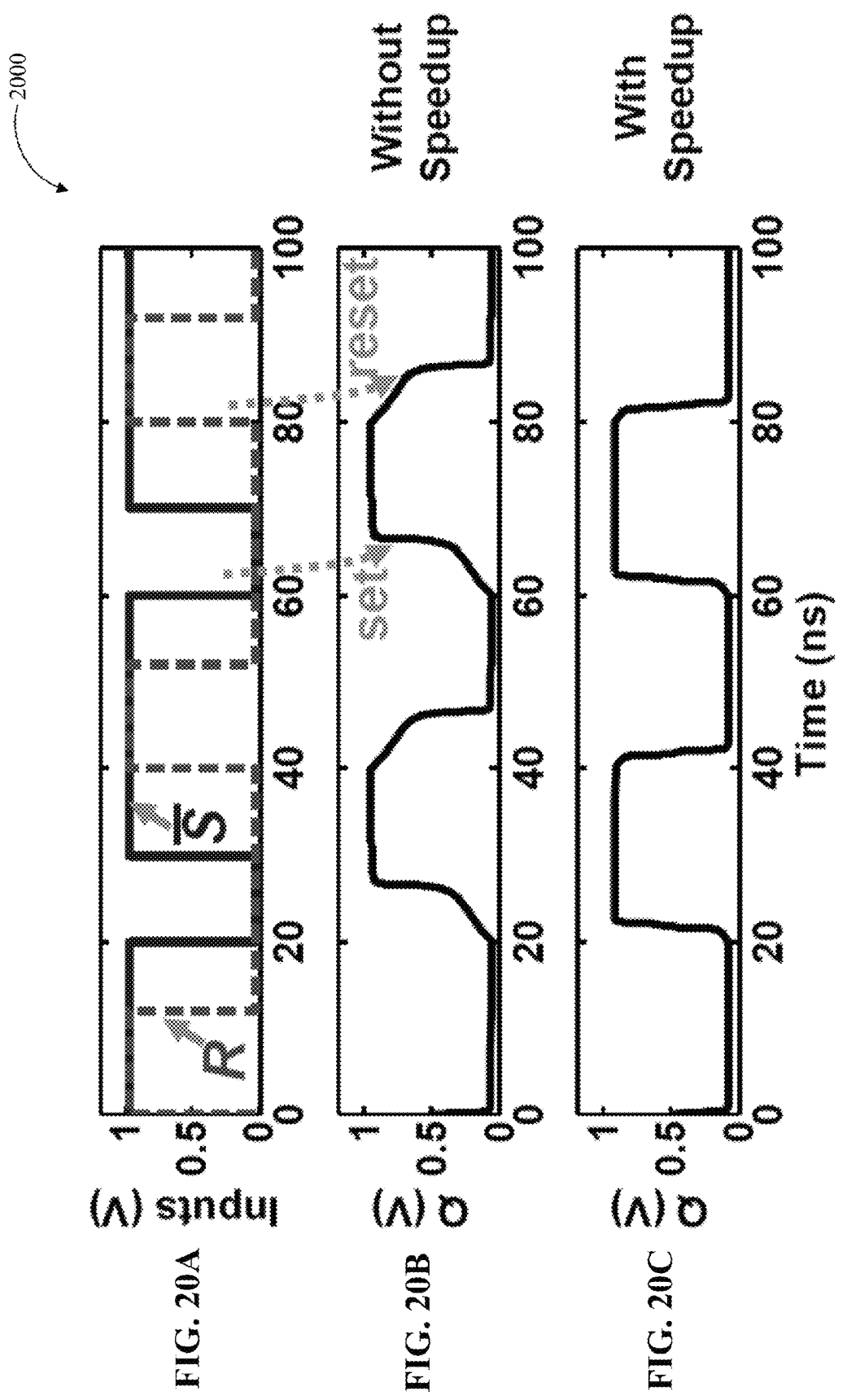

DEVICES FOR UTILIZING SYMFETS FOR LOW-POWER INFORMATION PROCESSING

FIELD OF THE DISCLOSURE

The present disclosure relates generally to the field of low-power information processing hardware and, more specifically, to devices for utilizing symmetric tunneling field-effect transistors (SymFETs) for low-power information processing.

BACKGROUND OF RELATED ART

In the pursuit of low-power information processing hardware, many new post-complementary metal-oxide-semiconductor (CMOS) transistors have been created in the past few decades. One desirable property for these new devices is a large on-current to off-current ratio, which enables low-power, low-voltage operation. Initial studies and experiments on a class of emerging field effect transistor (FET) technologies that operate upon the principle of tunneling between 2-D materials have indicated their potential for low-power operation. However, current-voltage characteristics (or "I-V curves") of these devices appear to be dissimilar to those of today's metal-oxide-semiconductor field-effect transistors (MOSFETs), and instead exhibit bell-curve characteristics. Further, double-layer graphene transistors, such as SymFETs, and bilayer pseudo-spin FETs (BiSFETs) may all possess at least some of the aforementioned characteristics. Such behavior is also observed in some molecular transistors and single-electron transistors. To date, though, little if any work has considered how such devices might be employed for the purposes of digital logic, which will ultimately help to determine the "fate" of these new device technologies. For example, scientists have not yet described how to leverage the use of SymFETs in sequential circuits. Therefore, it is both important and desirable to utilize new SymFET-based devices that are superior to CMOS designs with regards to compactness, speed, and/or energy efficiency.

Until now, little has been done in the way of designing circuits comprised of SymFETs and other devices with similar graphene-insulator-graphene structures. New topologies involving such devices can benefit from unique I-V curves. Known attempts to incorporate graphene-insulator-graphene structures to date have not proven helpful. For example, one recent gate design uses BiSFETs at a supply voltage of 25 millivolts (mV), but a 25 mV supply is likely to prove challenging when considering supply, substrate, and device noises, where, in practice, the ripple on supply rails often amounts to a few tens of mV. On the other hand, some researchers have proposed a static random-access memory (SRAM) cell without access transistors. Due to the negative differential resistance (NDR) of that device, the circuit is bistable while having only two transistors as opposed to four in a similar CMOS SRAM cell.

Therefore, a need exists for several new Boolean gates that are practical and take advantage of unique I-V curves. Even simple gates, such as an inverter, for example, exhibit new properties (i.e., hysteresis) when realized by way of SymFETs. The present disclosure concerns several new circuits with a topology different from those of popular CMOS designs. To quantify the performance of these new SymFET-based gates and determine their potential benefits, the present disclosure benchmarks these gates against existing CMOS-functional equivalents. The present disclosure also examines the relationship between SymFET and resonant tunneling diodes (RTDs) to verify the feasibility of adopting RTD-based circuits. In turn, the present disclosure will aid in developing new circuits with other SymFET-like transistors and also assist in improving future transistors.

BRIEF DESCRIPTION OF THE DRAWINGS

FIG. 11C shows a corresponding truth table applicable to both the SymFET- and CMOS-based IMPLY gates of FIGS. 11A-11B.

FIGS. 13D-13E together show an input voltage chart and an output voltage chart based on the example SymFET-based MAJORITY gate of FIG. 13B.

FIGS. 18A-18B show a simulated transient response of the example SymFET-based RS latch of FIG. 16A.

FIGS. 20A-20C together show input and output voltages for latches with and without speedup.

DETAILED DESCRIPTION

The following description of example devices is not intended to limit the scope of the description to the precise form or forms detailed herein. Instead the following description is intended to be illustrative so that others may follow its teachings.

Device Description and Model

Figures 1A, 1B:
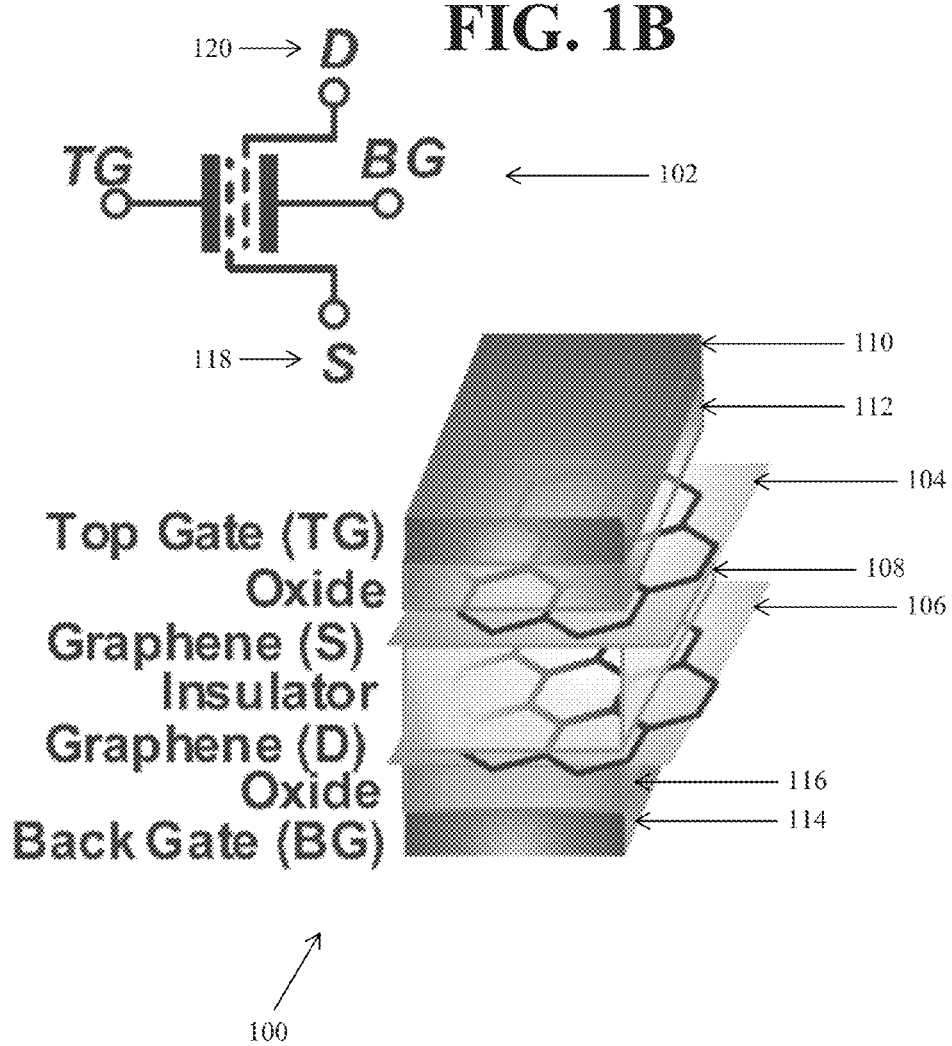
FIG. 1A is an exploded graphic perspective view of an example SymFET.
FIG. 1B is a circuit diagram of the example SymFET of FIG. 1A.
Figure 2:
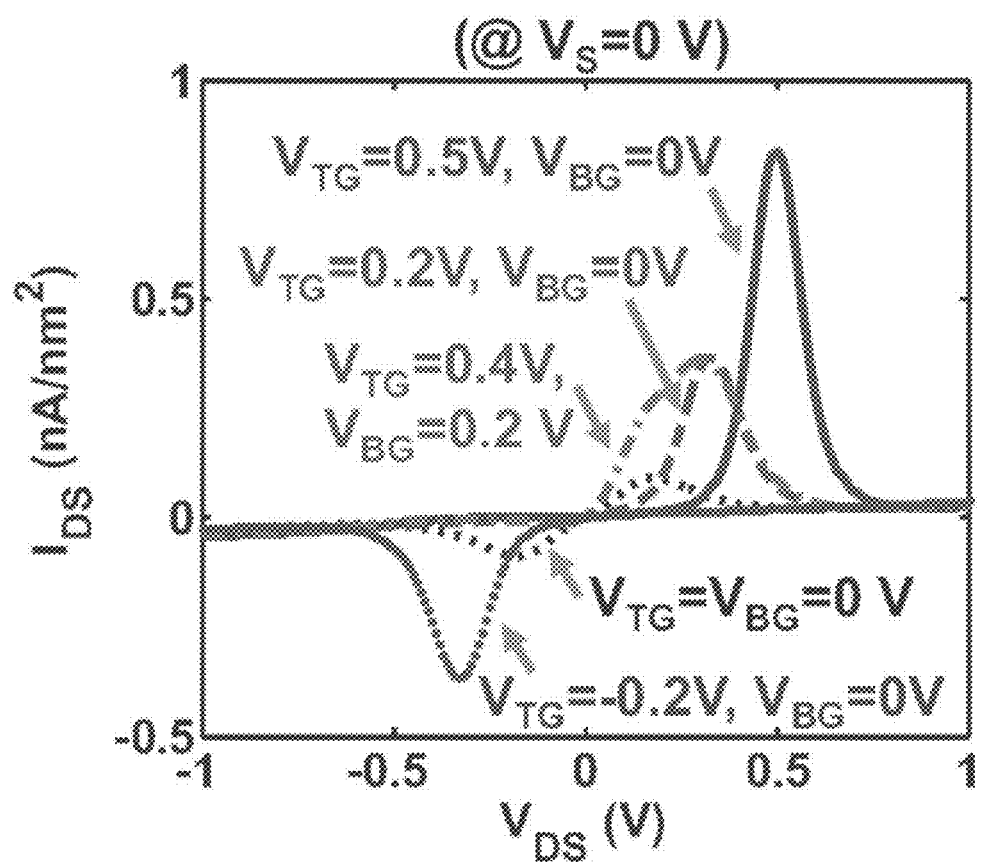
FIG. 2 is a chart plotting current against voltage for various voltages applied to top and back gates of the example SymFET of FIGS. 1A-1B.

FIG. 1A shows a physical structure of an example SymFET 100 along with an electrical diagram 102 in FIG. 1B representing the example SymFET 100. In some examples, operation of the SymFET 100 shown in FIGS. 1A-1B is summarized as follows. Tunneling occurs between two example graphene layers 104, 106 separated by an example thin insulator 108. The voltages associated with an example top-gate (TG) 110, which is disposed above an example first oxide layer 112, and an example back-gate (BG) 114, which is disposed below an example second oxide layer 116, change the carrier type/density of the graphene layers 104, 106 by electrostatic field. In the example, shown in FIGS. 1A-1B, the graphene layer 104 is associated with a source 118, while the graphene layer 106 is associated with a drain 120. Because tunneling probability depends on occupied/empty states on both sides of the tunneling barrier, voltages of the top and back gates 110, 114 can modulate the drain-source current ($I_{DS}$). In addition, FIG. 2 illustrates I-V characteristics 200 of the example SymFET 100 shown in FIGS. 1A-1B under various load conditions. Peak currents for each respective $I_{DS}$—drain-source voltage ($V_{DS}$) curve depend on the voltages at the top and back gates 110, 114.

To build a tabular representation of $I_{DS}$ in terms of the terminal voltages for a device constructed with undoped graphene sheets, the present disclosure employs the previously-published analytical models described in P. Zhao et al., "SymFET: A Proposed Symmetric Graphene Tunneling Field-Effect Transistor," *IEEE Trans. Electron Devices*, vol. 60, no. 3, pp. 951-957 (March 2013), R. M. Feenstra et al., "Single-particle tunneling in doped graphene-insulator-graphene junctions," *J. Appl. Phys.*, vol. 111, no. 4, p. 043711 (April 2012), and S. C. de la Barrera et al., "Theory of graphene-insulator-graphene tunnel junctions," *J. Vac. Sci. Technol. B*, vol. 32, 04E101, (July/August 2014), all of which are hereby incorporated by reference in their entireties. The results are incorporated in a Verilog-A model such that the 4-terminal device can be used in simulation program with integrated circuit emphasis (SPICE) simulations.

In some examples, the device capacitances are constant and are based on planar capacitance between the TG 110 and the source 118, between the BG 114 and the drain 120, and between the drain 120 and the source 118. Moreover, in the examples disclosed below, both the TG 110 and the BG 114 have an effective oxide thickness (EOT) of 1.2 nanometers (nm). In some examples, the thin insulator 108 acting as a tunneling barrier is comprised of 1.34 nm-thick Boron-Nitride (i.e., 4 layers of h-BN). Still further, coherence length determines what percentage of the graphene layers 104, 106 are structurally perfect. And in these examples, the active device area is assumed to be a square and the coherence length is 0.75 times the square side. This follows because researchers are generally limited to large graphene sheets, which prevents researchers from fully accounting for edge effects. Therefore, unless otherwise stated, the minimum-size transistor in the examples below has been conservatively selected to be 100 nm-by-100 nm, though considerations for scaling to smaller dimensions are also disclosed below.

Yet further, those having ordinary skill in the art will recognize that the aforementioned design parameters are merely examples and that the characteristics of the disclosed devices may vary. For instance, in some examples the disclosed devices may be asymmetric with no BG, even though N-type and P-type transistors may be required. In other words, to achieve the same functionalities, a SymFET with a constant $V_{BG}$ can be replaced with a device without a BG but with a doped drain (or source).

Inverter/Buffer

Figure 3B:
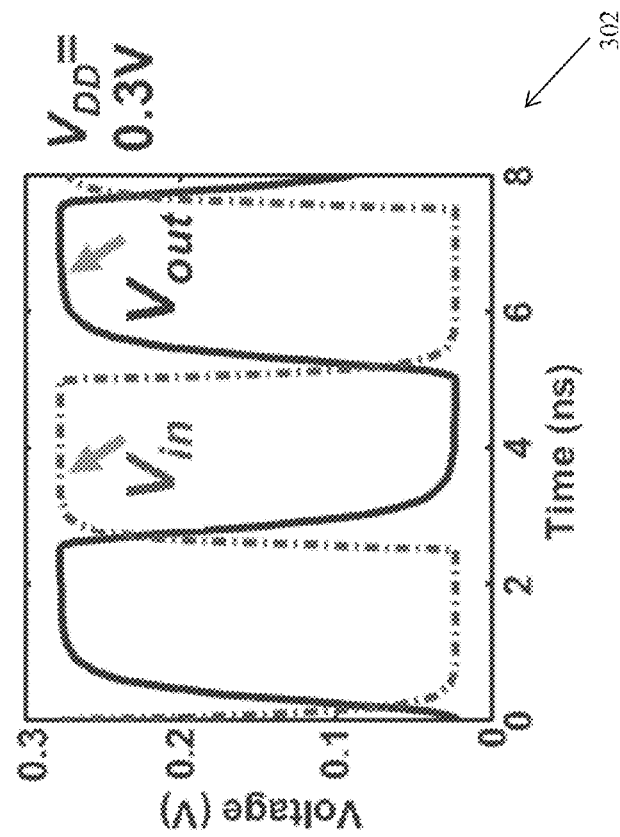
FIG. 3B is chart showing voltage in/out signals of the example SymFET-based inverter of FIG. 3A when loaded by a fanout-of-4 (FO4) inverter at $V_{DD}=0.3$ V.
Figure 3A:
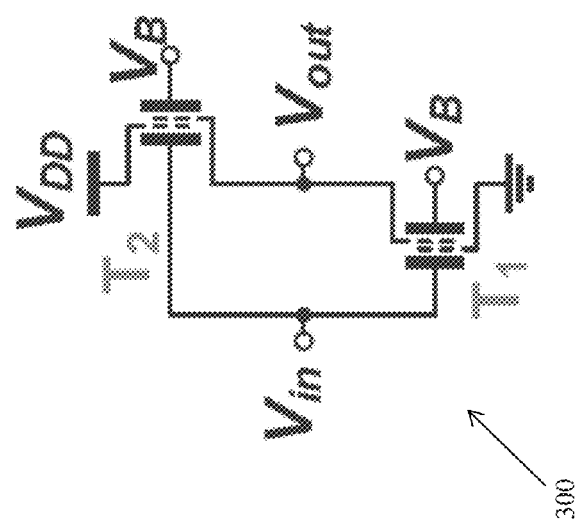
FIG. 3A is a circuit diagram of an example SymFET-based inverter.
Figures 4A, 4B, 4C, 4D:
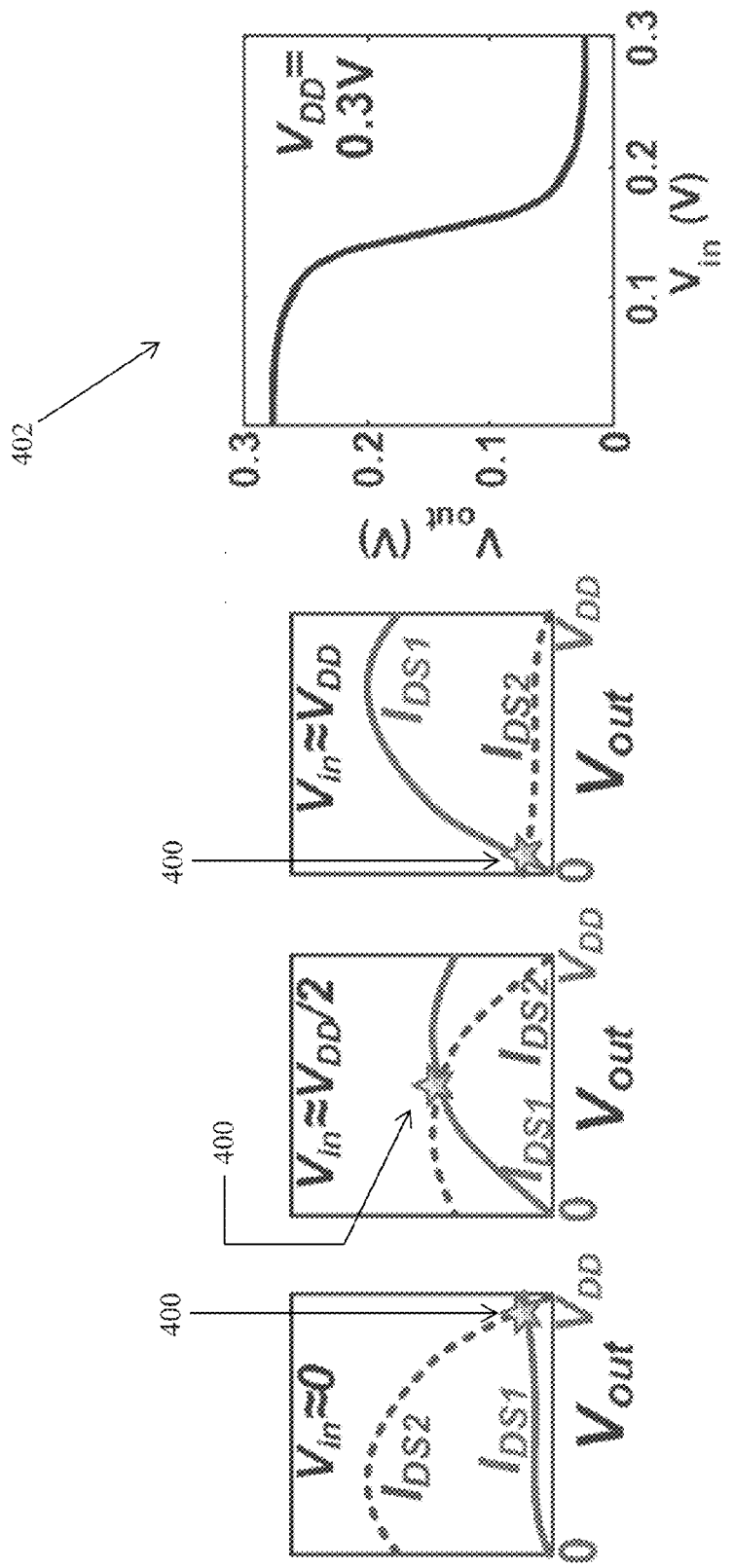
FIGS. 4A-4C together are a series of charts showing the variation in currents at first and second transistors $T_1$, $T_2$ of the example SymFET-based inverter of FIG. 3A where $V_{DD}=0.3$ V, with quiescent points shown by a star, along with a chart in FIG. 4D plotting the transfer characteristics of the SymFET-based inverter of FIG. 3A.

Turning now to FIG. 3A, an example inverter circuit 300 having a first SymFET $T_1$ and a second SymFET $T_2$ is shown. If a bias voltage ($V_B$) is set close to half of a positive supply voltage ($V_{DD}$) of the second SymFET $T_2$ (i.e., $V_{DD}/2$), then for an input voltage ($V_{in}$) close to zero the first SymFET $T_1$ is off because a top gate voltage ($V_{TG}$) minus a back gate voltage ($V_{BG}$) differential is negative ($V_{TG}-V_{BG}<0$), and the second SymFET $T_2$ is on. As a result, an output voltage ($V_{out}$) will be close to the positive supply voltage $V_{DD}$ of the second SymFET $T_2$. As shown in a voltage-time chart 302 in FIG. 3B, a high-level input leads to a low-level output. FIG. 3B illustrates the relationship between input and output signals of the example inverter circuit 300 when loaded by a fanout-of-4 (FO4) inverter at $V_{DD}=0.3$ V. Furthermore, FIGS. 4A-4C illustrate how stable quiescent operating points 400 and $V_{out}$ of the example inverter circuit 300 can be determined using a characteristic of transistors where $V_{DD}$ is small. In particular, FIGS. 4A-4C show the respective currents through $T_1$ and $T_2$ at various input voltages $V_{in}$ when $V_{DD}=0.3$ V. FIG. 4D shows a chart 402 illustrating the transfer characteristics of the example inverter 300 when $V_{DD}=0.3$ V. The operation of the example inverter circuit 300 is similar to that of a CMOS inverter. Notably, the current in the off transistor is not zero, and consequently the output levels will not be equal to ground and $V_{DD}$. This is no problem so long as the noise margin is sufficiently large, namely, where $V_{DD}$ is greater than 0.2 V. Still, the leakage current results in static power dissipation.

Figures 5A, 5B, 5C, 5D:
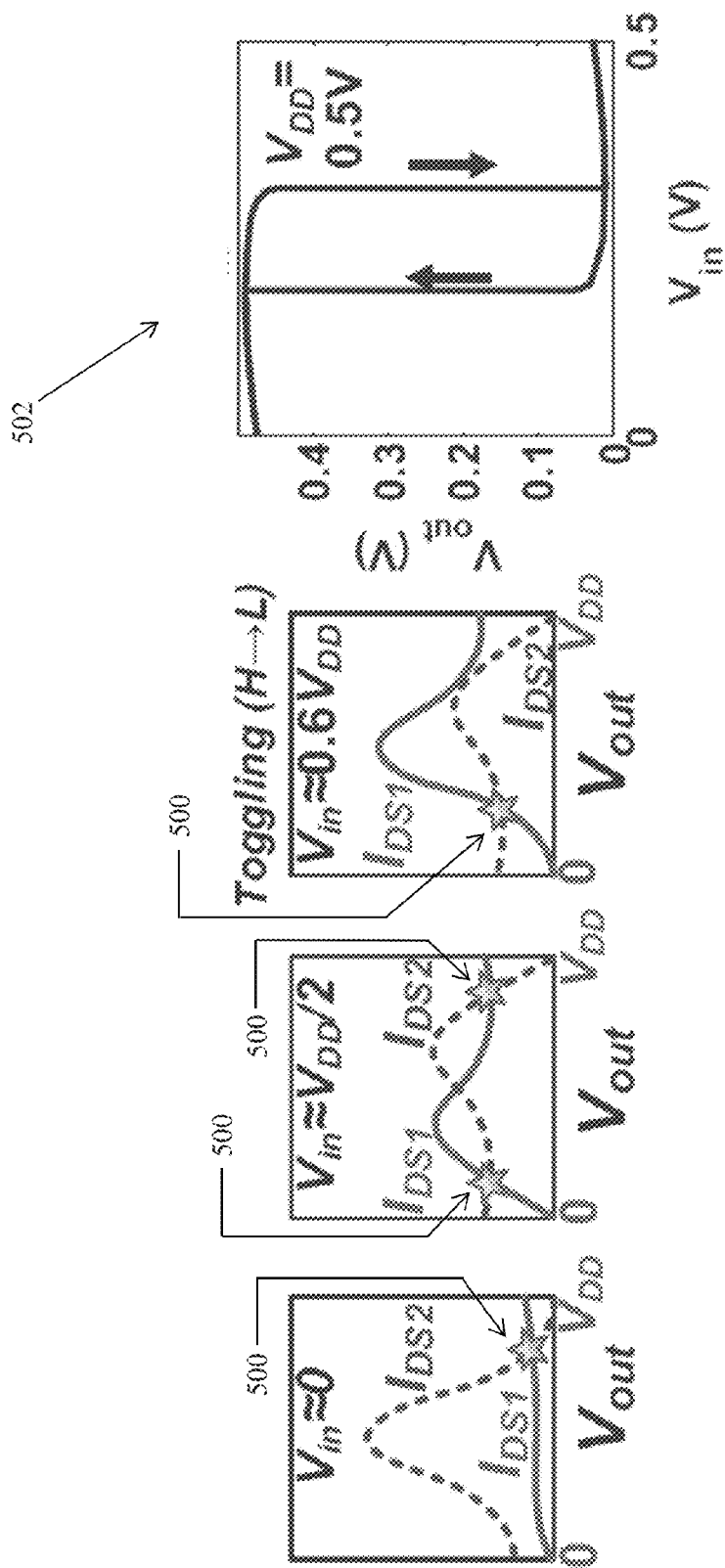
FIGS. 5A-5C together are a series of charts showing the variation in currents at first and second transistors $T_1$, $T_2$ of the example SymFET-based inverter of FIG. 3A where $V_{DD}=0.5$ V, with quiescent points shown by a star, along with a chart in FIG. 5D plotting the transfer characteristics of the SymFET-based inverter of FIG. 3A.

FIGS. 5A-5D are similar to FIGS. 4A-4D, but show stable quiescent operating points 500 of the example inverter circuit 300 when $V_{DD}$ is somewhat higher at 0.5 V. FIGS. 5A-5C show the respective currents through $T_1$ and $T_2$ at various input voltages $V_{in}$ when $V_{DD}=0.5$ V. When $V_{in}=V_{DD}/2$, the example inverter circuit 300 becomes bistable due to NDR. More specifically, when the input signal $V_{in}$ is close to $V_{DD}/2$, the circuit 300 has two possible outputs for the same input when $V_{DD}=0.5$ V. This condition is also shown in a chart 502 plotting $V_{out}$ against $V_{in}$ where $V_{DD}=0.5$ V. FIG. 5C, moreover, also shows a third possible, but unstable, point where $I_{DS1}=I_{DS2}$ when $V_{in}=0.6$ $V_{DD}$. This point is unstable because it lies on the NDR region of the I-V curve. The bistability manifests itself as the hysteresis in the characteristic of the gate, resulting in a Schmitt-trigger inverter. For example, when output is high, and $V_{in}$ is increasing, the output remains high even for an input close to $V_{DD}/2$. But when input approaches roughly 0.6 $V_{DD}$, the circuit 300 changes from bistable to monostable and the output $V_{out}$ toggles to a low level, as shown in the chart 502.

Figures 6A, 6B, 6C:
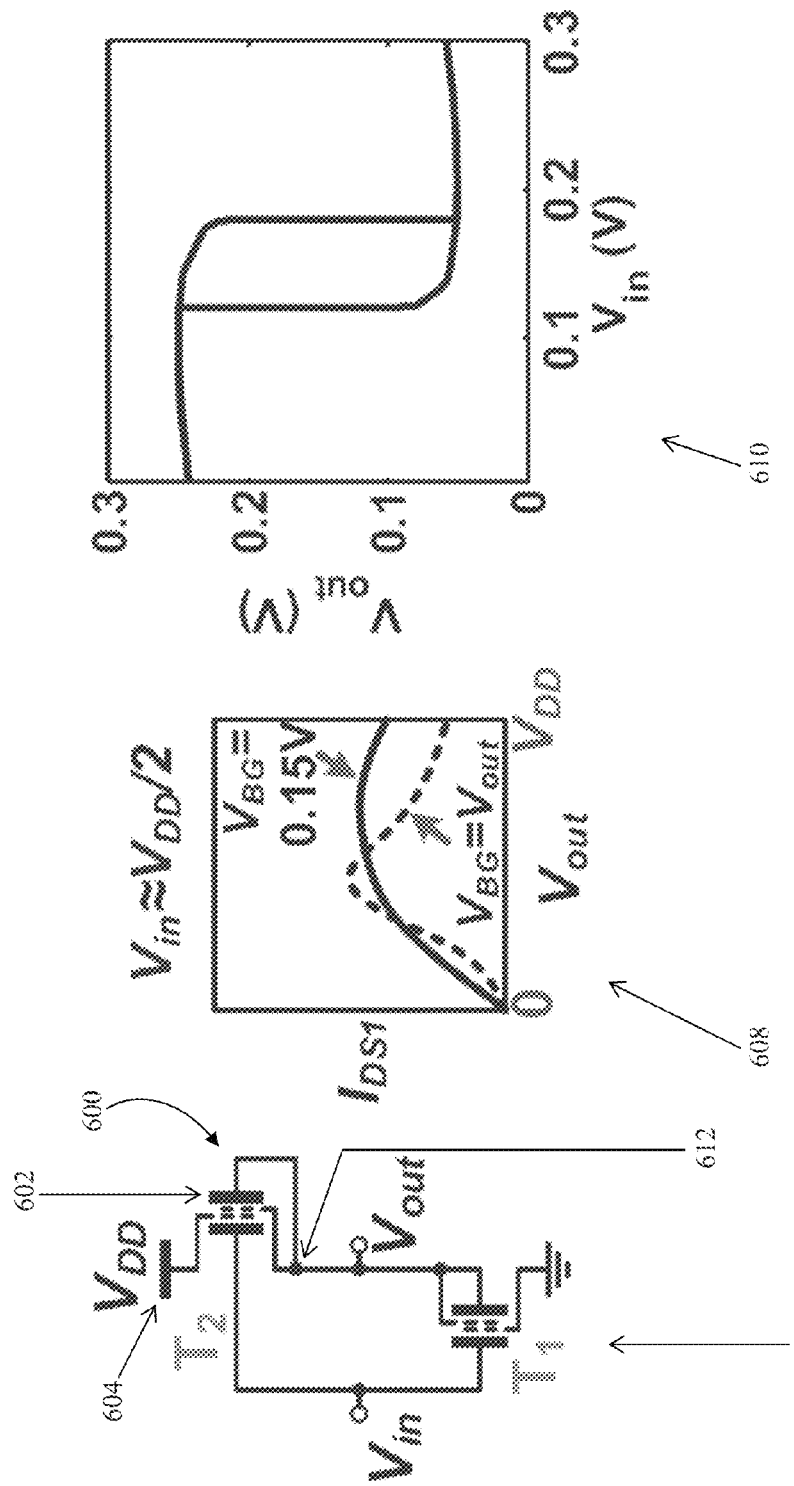
FIG. 6A shows a circuit diagram for an example Schmitt-trigger inverter.
FIG. 6B shows a chart plotting the drain current of a first transistor $T_1$ of the example Schmitt-trigger inverter against the same current based on the example SymFET-based inverter of FIG. 3A.
FIG. 6C shows a chart indicating the transfer characteristics of the example Schmitt-trigger inverter for $V_{DD}=0.3$ V.

In some instances, a low-voltage Schmitt-trigger inverter may be required. Therefore, in some examples, a positive feedback 600 from a BG 602 to a drain 604 can be incorporated into an example Schmitt-trigger inverter circuit 606 as shown in FIG. 6A. As shown in an $I_{out}-V_{out}$ curve 608 of FIG. 6B, the feedback 600 brings the current of transistors $T_1$ and $T_2$ down at large $|V_{DS}|$ and makes the $I_{out}-V_{out}$ curve 608 similar to that of FIGS. 4A-4C, where Vin=$V_{DD}/2$. The attained hysteresis for a small $V_{DD}$ of 0.3V is observed in a chart 610 plotting $V_{out}$ against $V_{in}$ in FIG. 6C. As those having ordinary skill in the art will recognize, the difference between the example circuit 300 in FIG. 3A and the example circuit 606 in FIG. 6A can be explained when the input is increasing and just passes $V_{DD}/2$. For the circuit 300, the value of $V_{TG1}-V_{BG1}=V_{in}-V_{DD}/2$ becomes positive and hence $I_{DS1}$ becomes larger than $I_{DS2}$, whereas for the circuit 606, $V_{TG}-V_{BG}$ of $T_1$ is still negative for $V_{in}\approx V_{DD}/2$ as the BG 602 is connected to an output node 612 coupled to $V_{out}$.

Figures 7A, 7B:
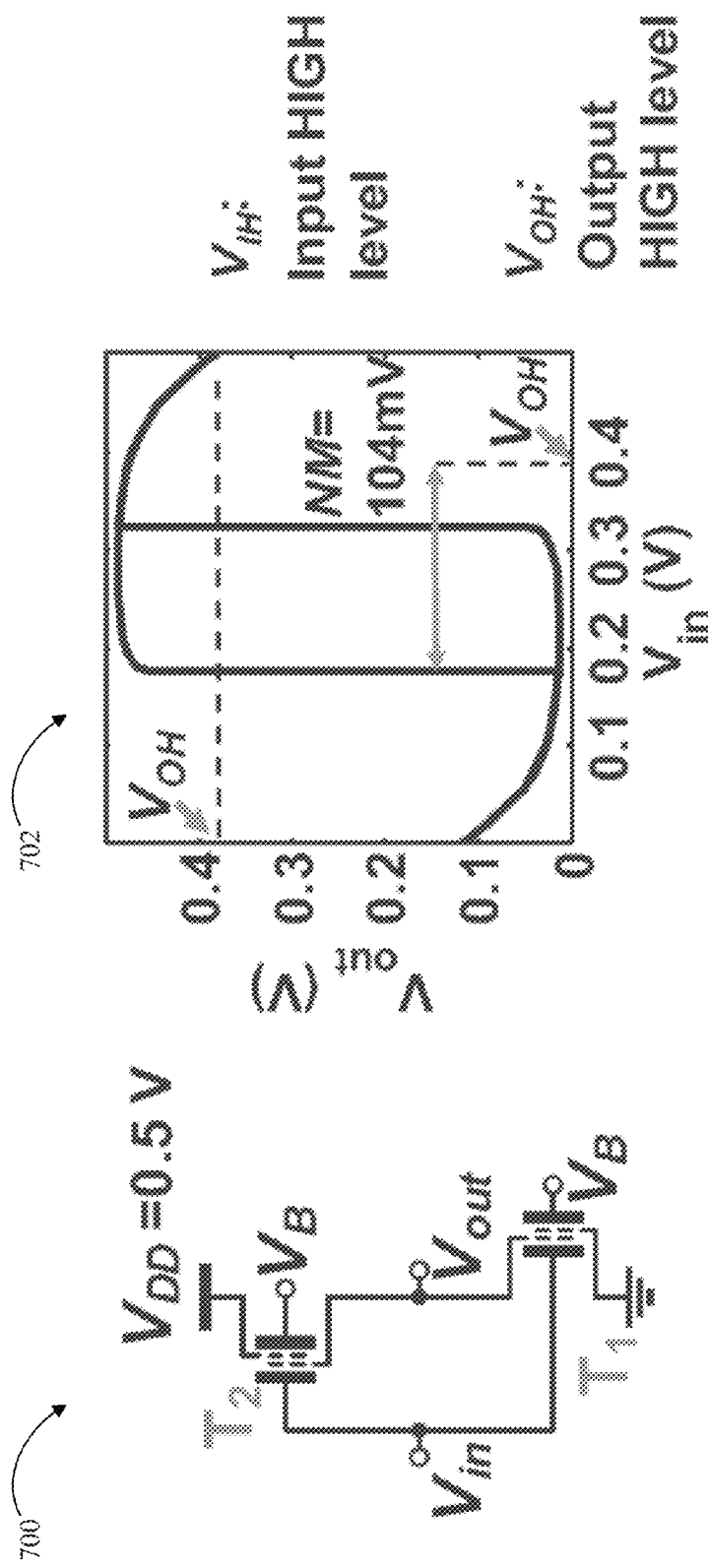
FIG. 7A is a circuit diagram of an example SymFET-based buffer.
FIG. 7B is a chart plotting voltage out against voltage in for the example SymFET-based buffer of FIG. 7A.

An example buffer 700 is illustrated in FIG. 7A. Compared to an inverter, the role of TG and BG terminals of transistors $T_1$ and $T_2$ are interchanged in the example buffer 700. The buffer 700 can also exhibit hysteresis in its characteristic, as shown in a chart 702 plotting $V_{out}$ against $V_{in}$. If the hysteresis is undesirable, an example circuit 800 shown in FIG. 8A may be used instead. In the example circuit 800, added negative feedback 802 eliminates the bistability evident in the example buffer 700. A chart 804 plotting $V_{out}$ against $V_{in}$ demonstrates that the example circuit 800 does not involve hysteresis. Further, those having ordinary skill in the art will recognize that with static CMOS logic it is not possible to construct circuits similar to those illustrated in FIGS. 7A and 8A. As a result, two inverters are often cascaded to build a buffer.

NAND/NOR/IMPLY

Figure 9A:
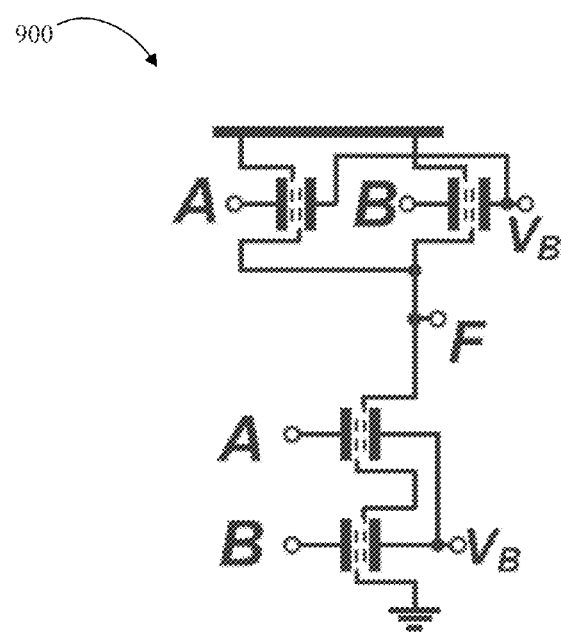
FIG. 9A is a circuit diagram of an example SymFET-based NAND gate.

An example NAND gate 900 is shown in FIG. 9A. Although the example NAND gate 900 provides desirable functionality, it is not any less complex than its static CMOS counterpart. That said, more compact gates are made possible by using the nonlinear behavior of SymFETs to build pseudo-SymFET gates (similar to pseudo-nMOS style logic).

Figure 9B:
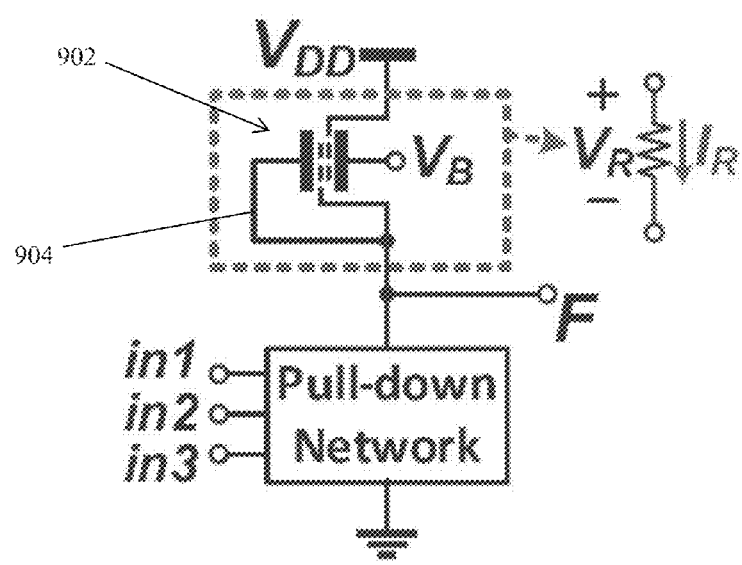
FIG. 9B is a circuit diagram of a pseudo-SymFET logic style gate.
Figure 9C:
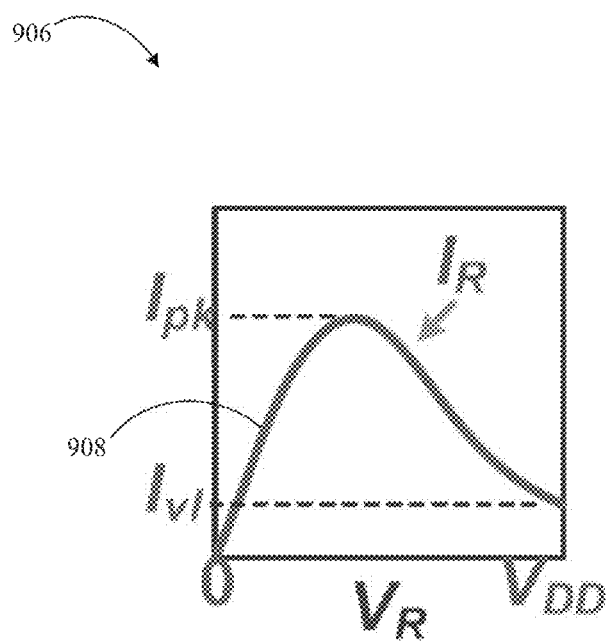
FIG. 9C is a chart plotting the I-V curve of the pseudo-SymFET logic style gate of FIG. 9B, where a nonlinear load resistance was implemented by SymFET.

In FIG. 9B, an example SymFET 902 with feedback 904 is used as the load. When compared with the conventional NAND gate 900 shown in FIG. 9A using conventional logic, the SymFET 902 using pseudo-SymFET logic lowers the number of transistors required. For instance, if a conventional static CMOS circuit has N transistors, a pseudo-SymFET circuit will only require (N/2)+1 transistors. Further, the input capacitance of the gate is also cut by one half. The benefit of using a SymFET load compared with a linear resistor can be explained by way of an I-V curve 906 having a bell-curve shape 908 shown in FIG. 9C. In this example, the current passing through the device will be small (close to $I_{v1}$) for a low output level. In contrast, for a resistor, the current will be the largest when the output of the gate is low, resulting in large leakage. Similarly, in pseudo-N-type metal-oxide-semiconductor (pseudo-NMOS) circuits, the current is the largest when the output signal is low, since MOSFETs do not have NDR.

Figure 9D:
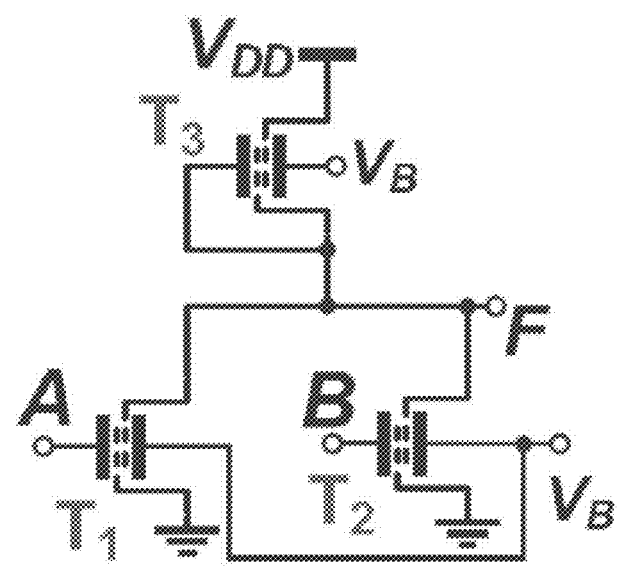
FIG. 9D is a circuit diagram of an example pseudo-SymFET OR gate.
Figures 9E, 9F:
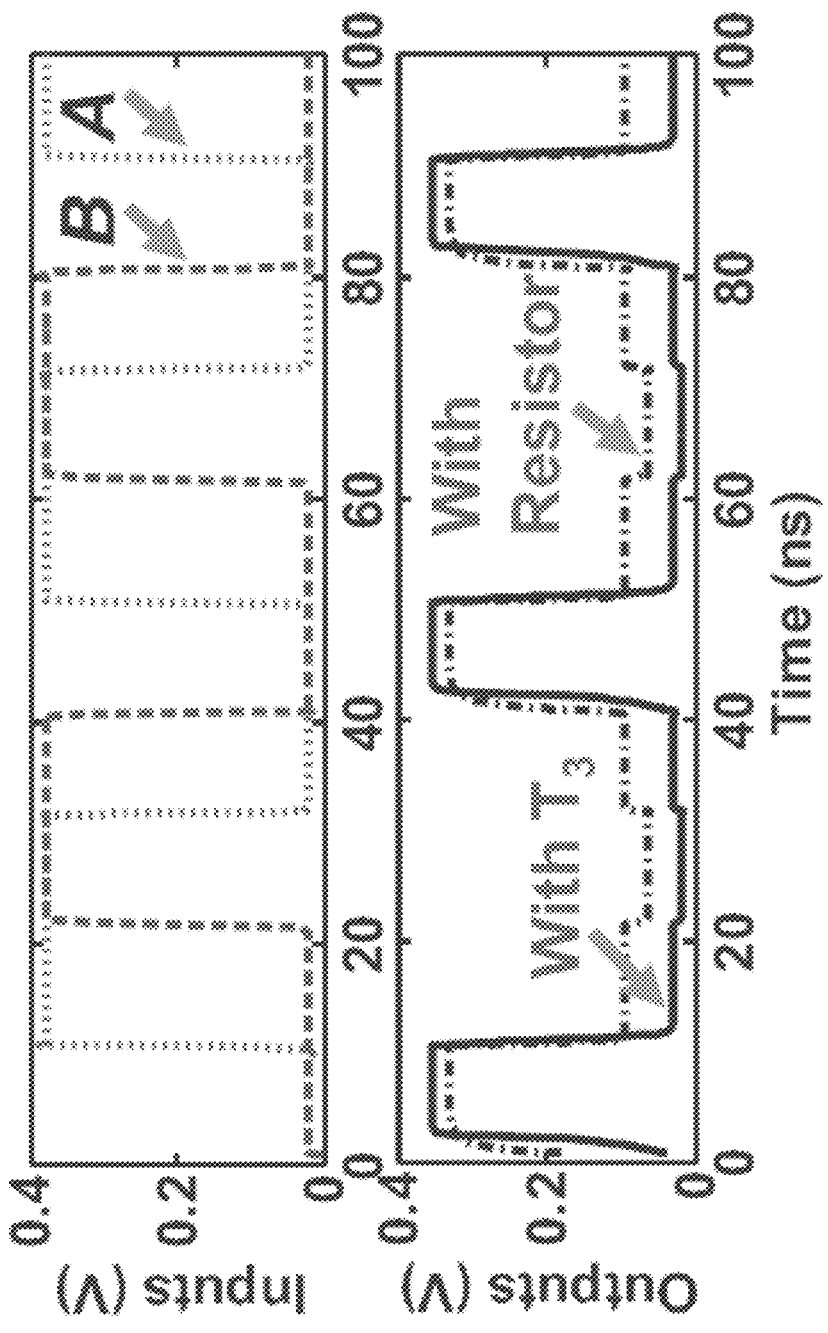
FIGS. 9E-9F together show input and output charts, where the output of a pseudo-SymFET NOR gate is compared with the output of a gate with linear resistive load (i.e., $V_{DD}=0.4$ V; size of a third transistor $T_3$ is twice that of first and second transistors $T_1$, $T_2$; load is a FO4 inverter).

An example pseudo-SymFET NOR gate 910 having three SymFETs $T_1$, $T_2$, and $T_3$ is shown in FIG. 9D. If the third SymFET $T_3$ is replaced with a 200 kΩ resistor, a similar output DC level and swing is achieved as depicted in FIGS. 9E-9F. However, the average power dissipation when using SymFET and resistive loads is 0.16 µW and 0.51 µW, respectively, for the input waveform shown in FIGS. 9E-9F. Hence, there is more significant leakage when a resistor is employed. More significant improvements with respect to power would be possible if $I_{v1}$ was reduced. However, a small $I_{v1}$ also has an adverse effect, namely, when the output changes from low to high, the load capacitance is initially charged with a current of $\approx I_{v1}$. This results in a slow rise time as seen in FIGS. 9E-9F, wherein the low-to-high delay with the SymFET-based and resistor-based loads is 1.6 ns and 0.46 ns, respectively.

Figure 10A:
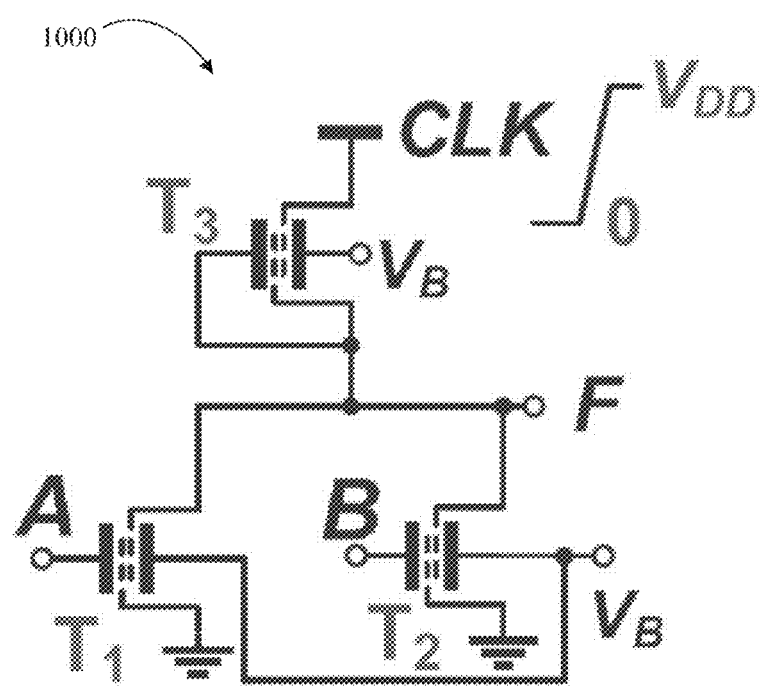
FIG. 10A is a circuit diagram of a dynamic pseudo-SymFET NOR gate.
Figures 10B, 10C, 10D:
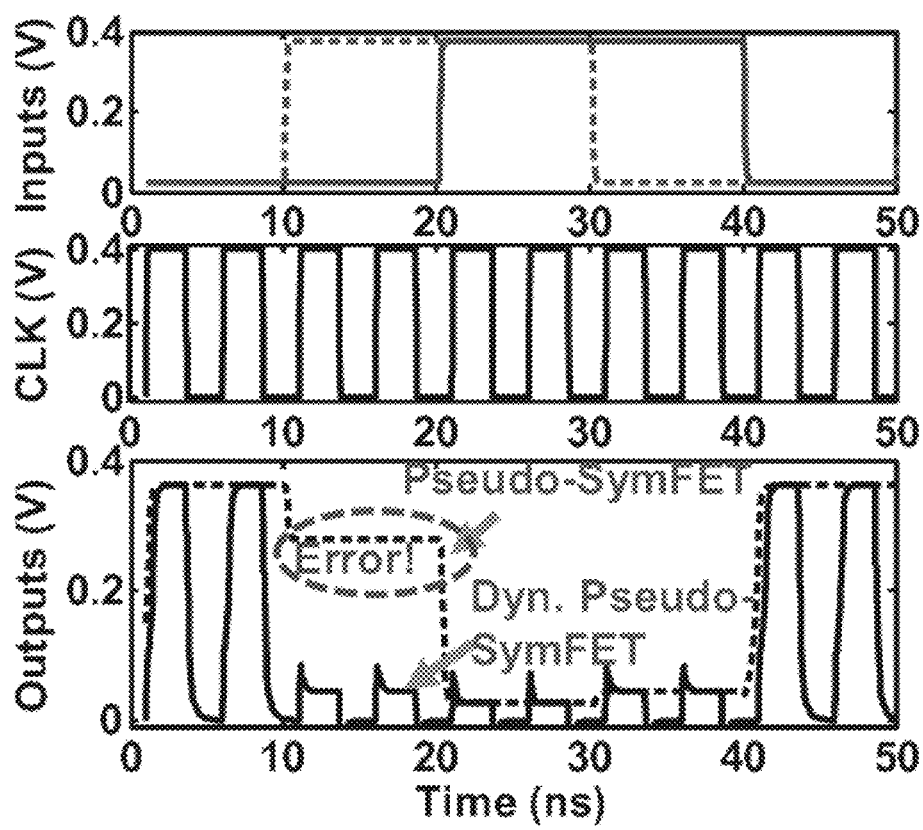
FIGS. 10B-10D together show the simulated input/output of a NOR gate, where the size of $T_3$ is three times that of first and second transistors $T_1$, $T_2$ and the load is a FO4 inverter.

To enhance the speed of the pseudo-SymFET gates, one might think to increase the size of the load transistor to have a larger $I_{v1}$. However, this could result in an incorrect output because the pull-down network might not be able to bring the output voltage down from a high state. Instead, in some examples a clocked-supply is used, as in resistance thermometer detector (RTD)-based circuits. The resulting circuit, which is referred to herein as "dynamic pseudo-SymFET logic" 1000 and includes three SymFETs $T_1$, $T_2$, and $T_3$, is shown in FIG. 10. In this example, an output signal is reset to zero during each clock cycle. The delay of the dynamic pseudo-SymFET circuit 1000 is reduced to 0.39 ns, whereas the power consumed from a clock input CLK is 0.12 µW. As shown in FIGS. 10B-10D, if the size of the third SymFET $T_3$ is three times that of the first and second SymFETs $T_1$ and $T_2$, the pseudo-SymFET NOR gate 910 of FIG. 9D can produce a wrong output, but the dynamic pseudo-SymFET gate 1000 functions correctly. Besides a larger third SymFET $T_3$, another aspect of the dynamic pseudo-SymFET logic 1000 helps improve the rise time of the circuit. More specifically, as the clock input CLK is rising, an output node is simultaneously being charged. When the clock input CLK reaches $V_{DD}$, the output voltage is somewhat higher than zero, and $|V_{DS3}|=V_R$ is smaller than $V_{DD}$. As a result, $I_{DS3}$ will be larger than $I_{v1}$ (see, e.g., FIG. 9C). Subsequently, the output node will be charged by a current larger than that of FIG. 9D.

Figures 11A, 11B:
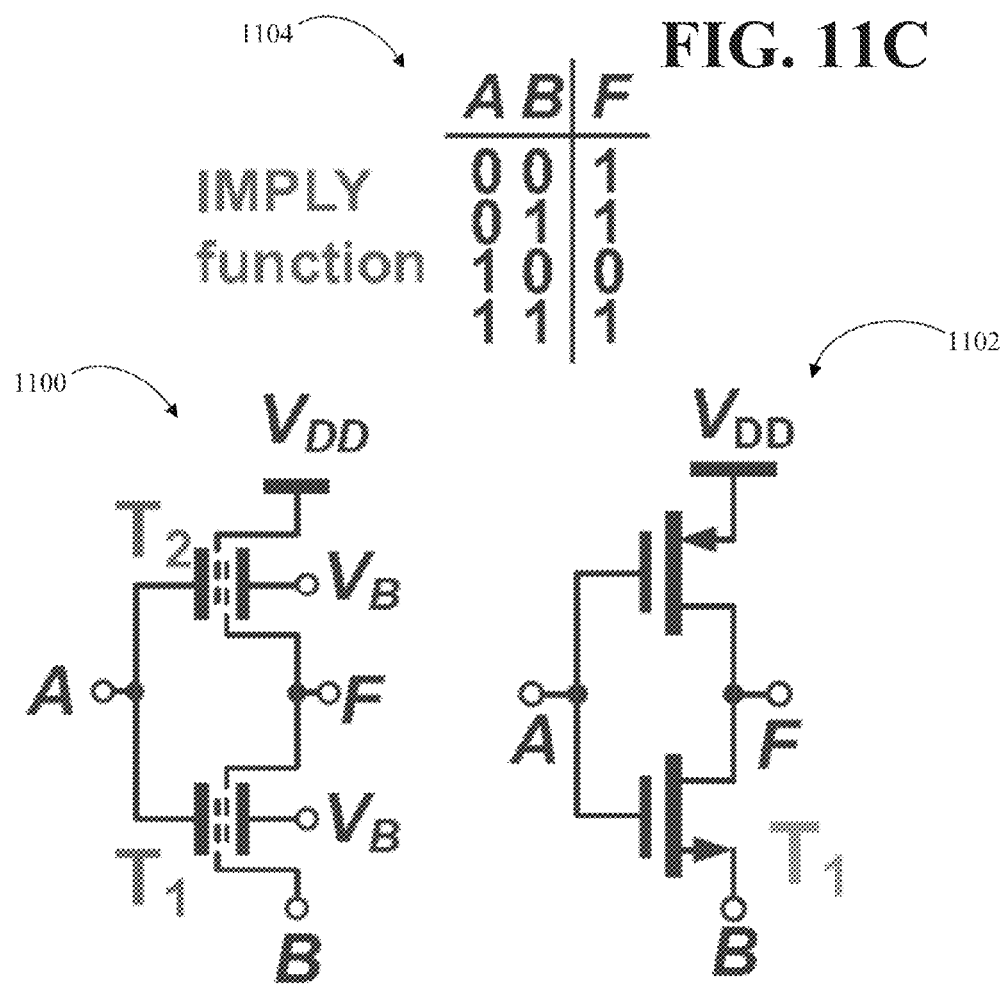
FIG. 11A is a circuit diagram for a SymFET-based IMPLY gate.
FIG. 11B is a circuit diagram for a CMOS-based IMPLY gate.
Figure 11D:
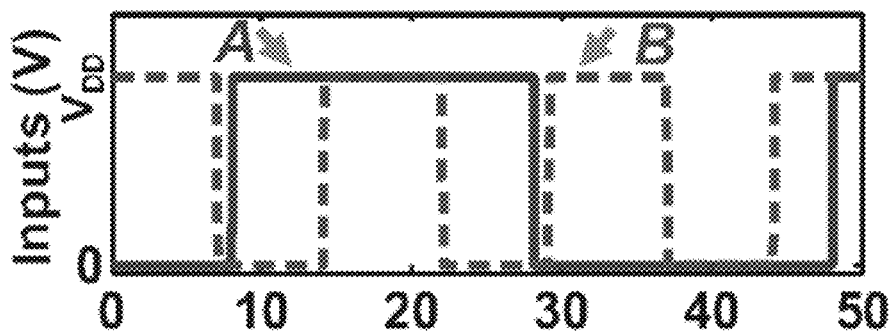
FIGS. 11D-11F together show several charts plotting input and output for the respective SymFET- and CMOS-based IMPLY gates of FIGS. 11A-11B.
Figure 11E:
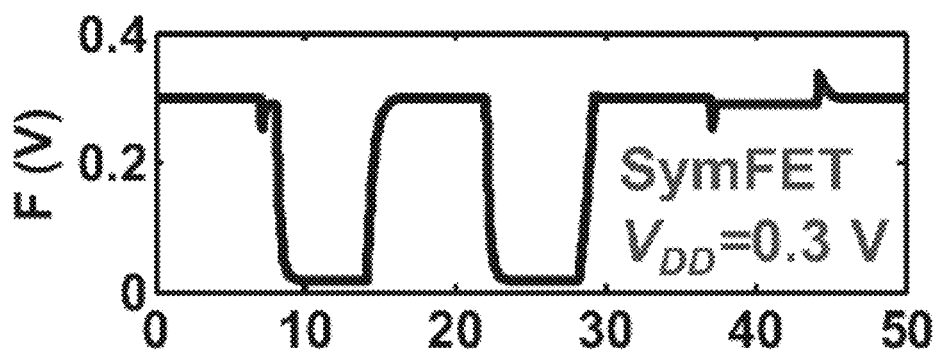
Figure 11F:
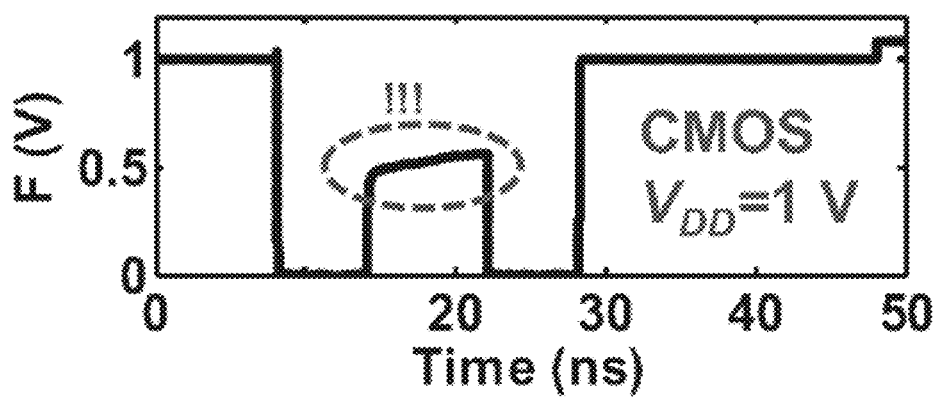
Figures 12A, 12B:
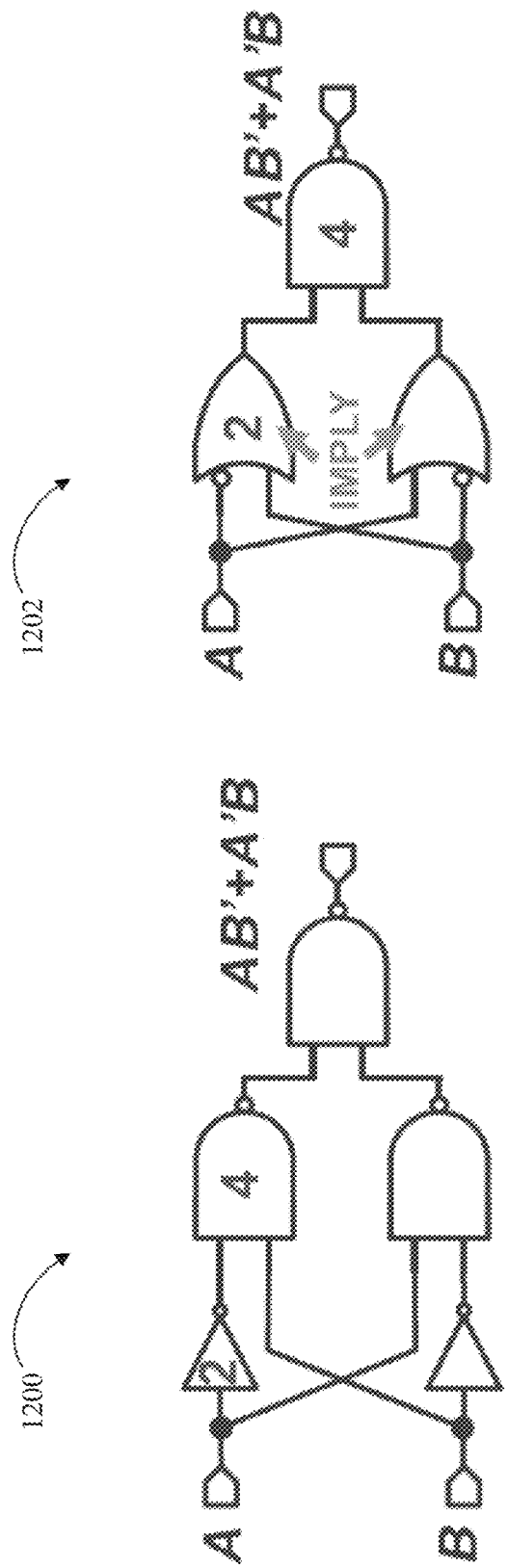
FIG. 12A is a circuit diagram of an example NAND-based XOR gate.
FIG. 12B is a circuit diagram of an example IMPLY-based XOR gate.

The IMPLY gate is another universal gate besides NAND and NOR that may be implemented with SymFETs. To that end, FIG. 11A shows an example IMPLY gate 1100 implemented by way of first and second SymFETs $T_1$ and $T_2$, whereas FIG. 11B shows an example IMPLY gate 1102 based on CMOS elements. In both circuits, an output F can be low only when A is high and B is low, and therefore the first SymFET $T_1$ is on, as reflected in a truth table 1104 of FIG. 11C. However, unlike the SymFET-based IMPLY gate 1100, the CMOS-based IMPLY gate 1102 has a shortcoming that often precludes its usage. Specifically, when A is high and B transitions from low to high, the charging of the output capacitive load is performed via a CMOS transistor $T_1$ in FIG. 11B. Moreover, as F increases and approaches $V_{DD}-V_{TH}$ (i.e., where $V_{TH}$ is the threshold voltage), the CMOS transistor $T_1$ is almost turned off, causing incomplete settling. By contrast, the SymFET-based IMPLY gate 1100 of FIG. 11A does not have this problem because it does not have a large $V_{TH}$. This much is demonstrated in FIGS. 11D-11F, where the functionality of the SymFET-based IMPLY gate 1100 at a $V_{DD}$ of 0.3 V, and 130-nm CMOS-based IMPLY gate 1102 at a $V_{DD}$ of 1 V are examined. In short, the SymFET-based IMPLY gate 1100 does not have this disadvantage inherent with the CMOS-based IMPLY gate 1102. One advantage of the example SymFET-based IMPLY gate 1100 is its fewer transistors in comparison with NAND or NOR gates. Traditional realization of IMPLY gates requires an inverter and a NAND gate, amounting to six transistors. For instance, two XOR gates 1200, 1202 are shown in FIGS. 12A-12B. The realization using the NAND-based design in FIG. 12A has sixteen transistors, whereas the IMPLY-based design in FIG. 12B has eight transistors.

MAJORITY Gate

Figure 13A:
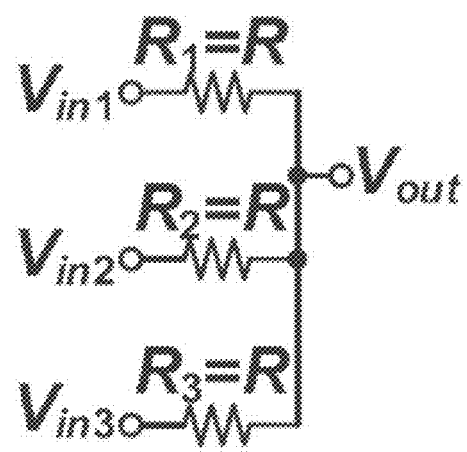
FIG. 13A is a circuit diagram of an example resistive network, which serves as the basis for a MAJORITY gate.

Another useful gate that is popular at least in the context of cellular automata and spintronics is the MAJORITY gate. It is possible to construct a SymFET-based MAJORITY gate with as few as three devices. The starting point for the SymFET-based MAJORITY gate is an example resistive network 1300 shown in FIG. 13A. If $V_{in1}=V_{in2}=0$ V and $V_{in3}=V_{DD}$ in the example resistive network 1300, the output voltage $V_{out}$ will be as follows:

$$V_{out}=V_{DD}(R_1\|R_2)/[(R_1\|R_2)+R_3]=V_{DD}/3$$

Figures 13B, 13C:
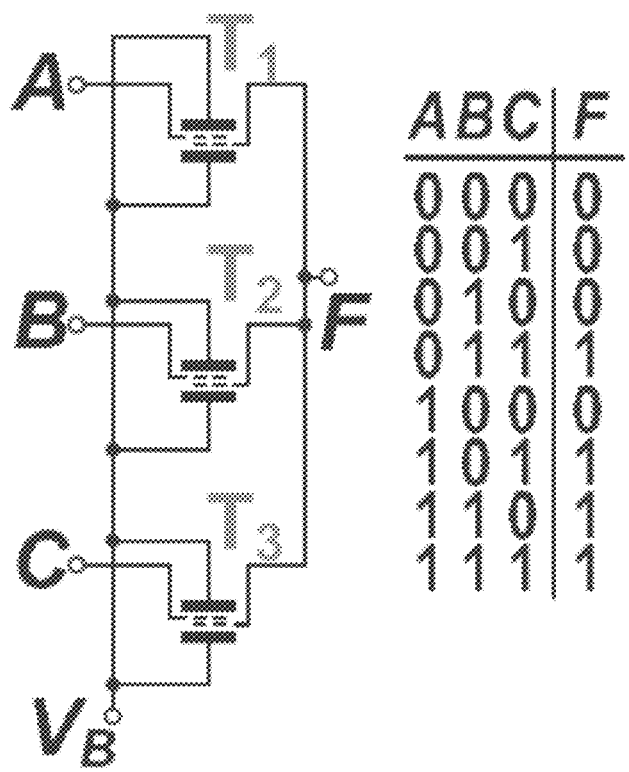
FIG. 13B is a circuit diagram of an example SymFET-based MAJORITY gate.
FIG. 13C is a corresponding truth table for the example SymFET-based MAJORITY gate of FIG. 13B.

To convert the circuit into a MAJORITY gate for this input combination, the output voltage level $V_{out}$ should be brought close to zero. The voltage across $R_1$ and $R_2$ is smaller than that of $R_3$, and if resistors are replaced with nonlinear elements whose resistances increase with voltage, $R_3$ will become larger than $R_1$ and $R_2$ and the output $V_{out}$ will be pushed toward ground. An example SymFET-based circuit 1302 of FIG. 13B is designed for this purpose. If input levels are 0 and $V_{DD}$, both gates of first, second, and third SymFETs $T_1$, $T_2$, $T_3$ are set to $V_B=V_{DD}/2$ (see the case of $V_{TG}=V_{BG}$ in FIG. 2 for the I-V curve of the device). The transient response of the example SymFET-based circuit 1302 when loaded with an FO4 inverter is shown in FIGS. 13D-13E. When both $V_{inB}$ and $V_{inC}$ are zero, an output F is also zero independent of input $V_{inA}$. Moreover, $V_{inA}$ changes the output F when one and only one of the $V_{inB}$ or $V_{inC}$ inputs is high. Here, each of the transistors $T_1$, $T_2$, $T_3$ behaves like a symmetric nonlinear resistor with an $I_{DS}-V_{DS}$ curve 1304 like that illustrated in FIG. 13F. If $V_{inA}=V_{inB}=V_{inC}=0$ V, the output F will be zero since there is no path to charge the output F. Similarly when all of the inputs $V_{inA}$, $V_{inB}$, and $V_{inC}$ are set to $V_{DD}$, the output voltage F will equal $V_{DD}$ as well. In another example, if the inputs $V_{inA}=V_{inB}=0$ V and $V_{inC}=V_{DD}$ (i.e., 001), $T_3$ has a large $|V_{DS}|$, and a large resistance as seen in FIG. 13F.

Figures 13F, 13G:
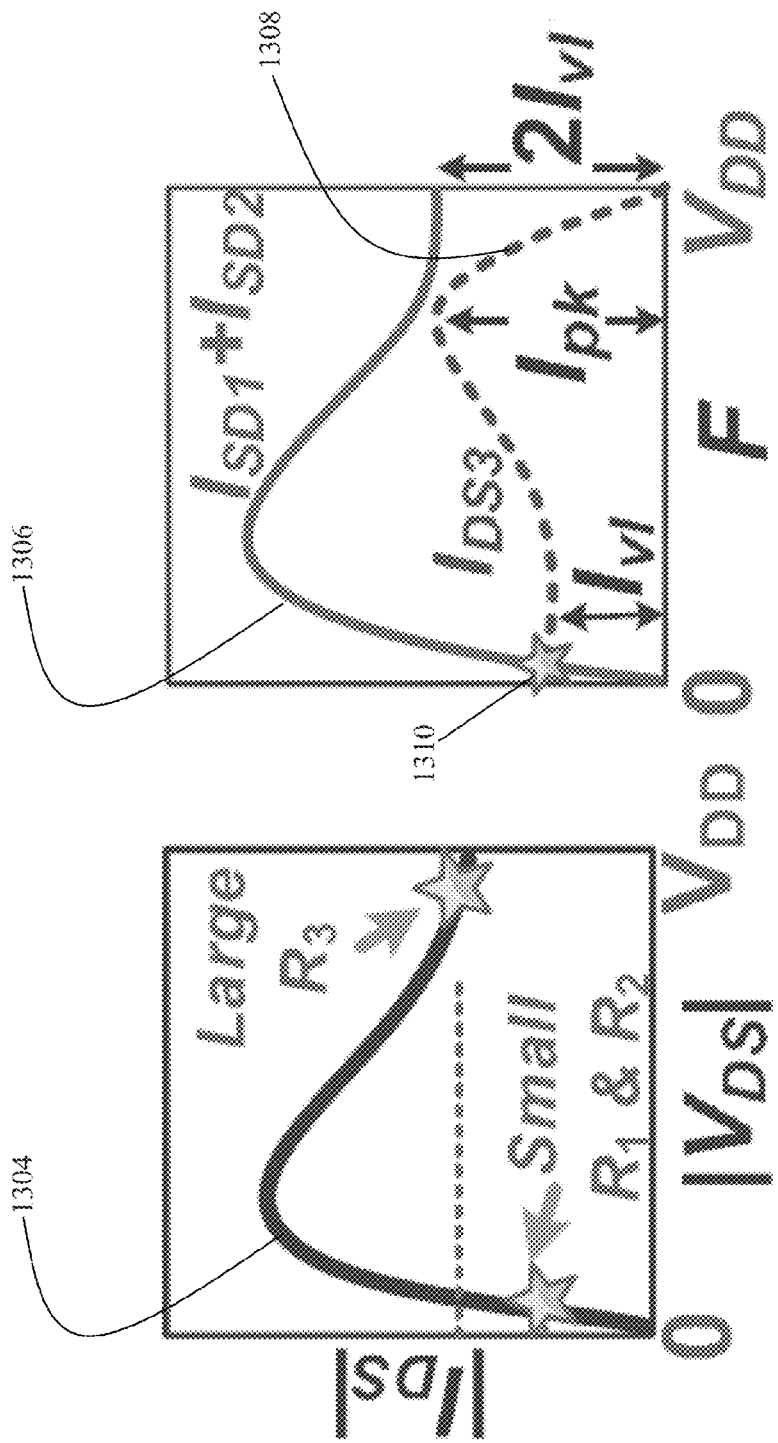
FIG. 13F is a chart plotting the absolute values of current versus voltage for a nonlinear SymFET-based resistor.
FIG. 13G is a chart plotting total current versus voltage for the example SymFET-based MAJORITY gate of FIG. 13B.

Further, FIG. 13G provides still more insight as to the operation of the example SymFET-based circuit 1302. FIG. 13G shows a total current 1306 discharging an output node ($I_{SD1}+I_{SD2}=2\times I_{SD1}$) and a current 1308 charging the output ($I_{DS3}$). An intersection 1310 of the two curves 1306, 1308 gives the output voltage F, which is close to zero as desired. The quiescent current of the transistors $T_1$, $T_2$, $T_3$ is $I_{SD1}=I_{SD2}\approx I_{v1}/2$ and $I_{DS3}\approx I_{v1}$. Even though a small $I_{v1}$ is ideal with respect to power dissipation considerations, the two curves should not have more than one intersection for correct operation. This means that in most examples $I_{v1}$ will be greater than $I_{pk}/2$.

Figure 14:
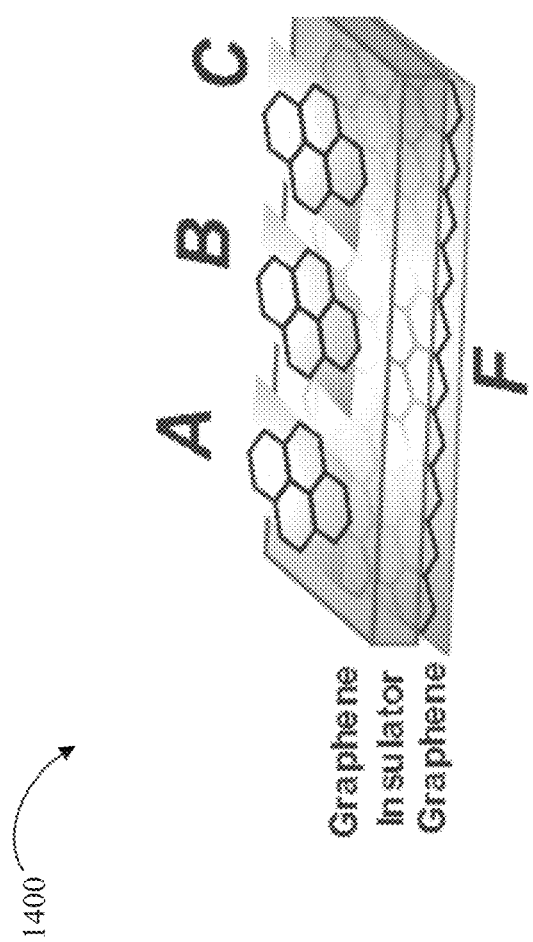
FIG. 14 is an exploded graphic perspective view of an example diode-connected SymFET.
Figure 15:
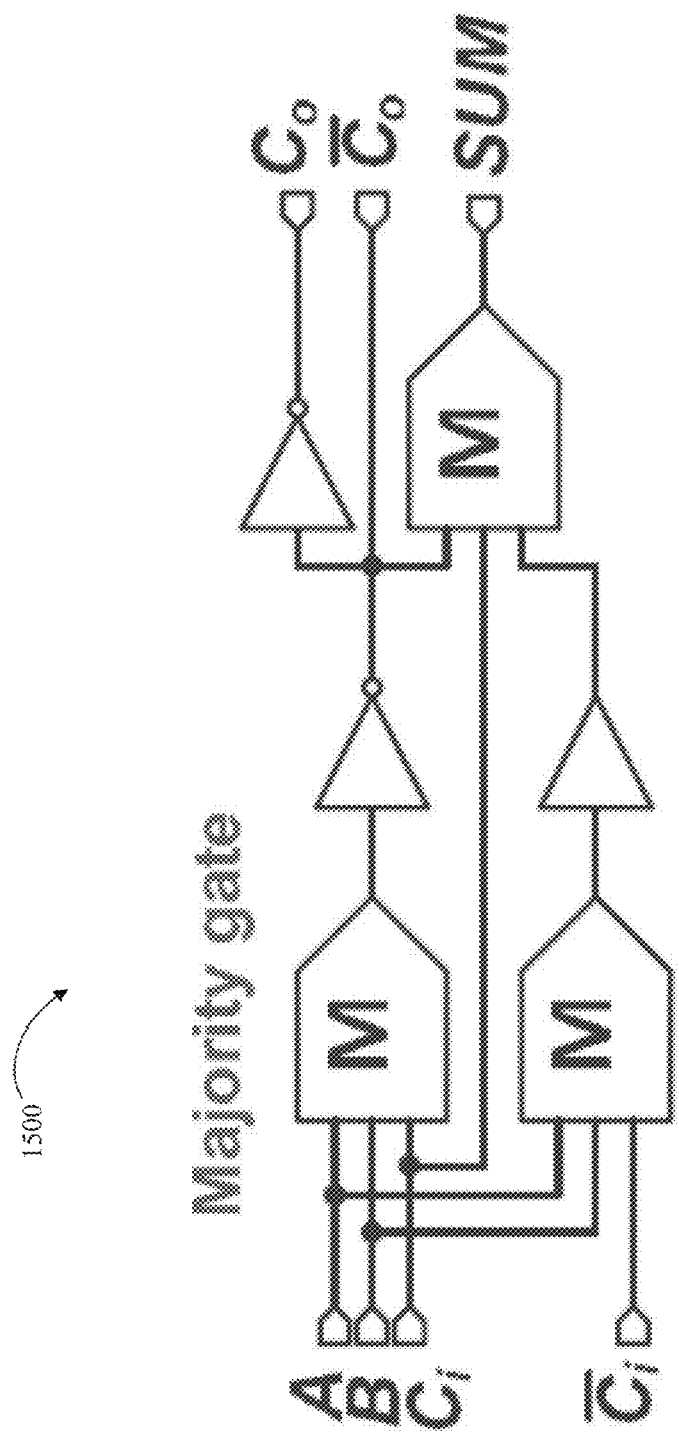
FIG. 15 is a circuit diagram of an example full adder cell.

An example diode-connected SymFET 1400 (e.g., where the TG and the BG are shorted, respectively, to the drain and the source) may in some instances exhibit the same behavior as shown in FIG. 13F. This in turn eliminates the need for $V_{inB}$. Even a single graphene-insulator-graphene junction without any gate exhibits this characteristic, and hence the example diode-connected SymFET 1400 of FIG. 14 can be utilized as a MAJORITY gate.

Combining inverters and MAJORITY gates enables the creation of an example full adder cell 1500, as shown in FIG.

15. The outputs of the MAJORITY gates are buffered to isolate the gates from each other. The example full adder cell circuit 1500 is designed to be cascadable by providing output carry ($C_o$) and its inverted signal ($\overline{C}_o$). The example full adder cell circuit 1500 has fifteen transistors in total as opposed to twenty-eight in a conventional CMOS adder cell such as the Mirror Adder.

The next few topologies for sequential circuit design utilizing SymFETs can offer low transistor count and low dynamic power dissipation.

RS Latch

Figures 16A, 16B, 16C, 16D:
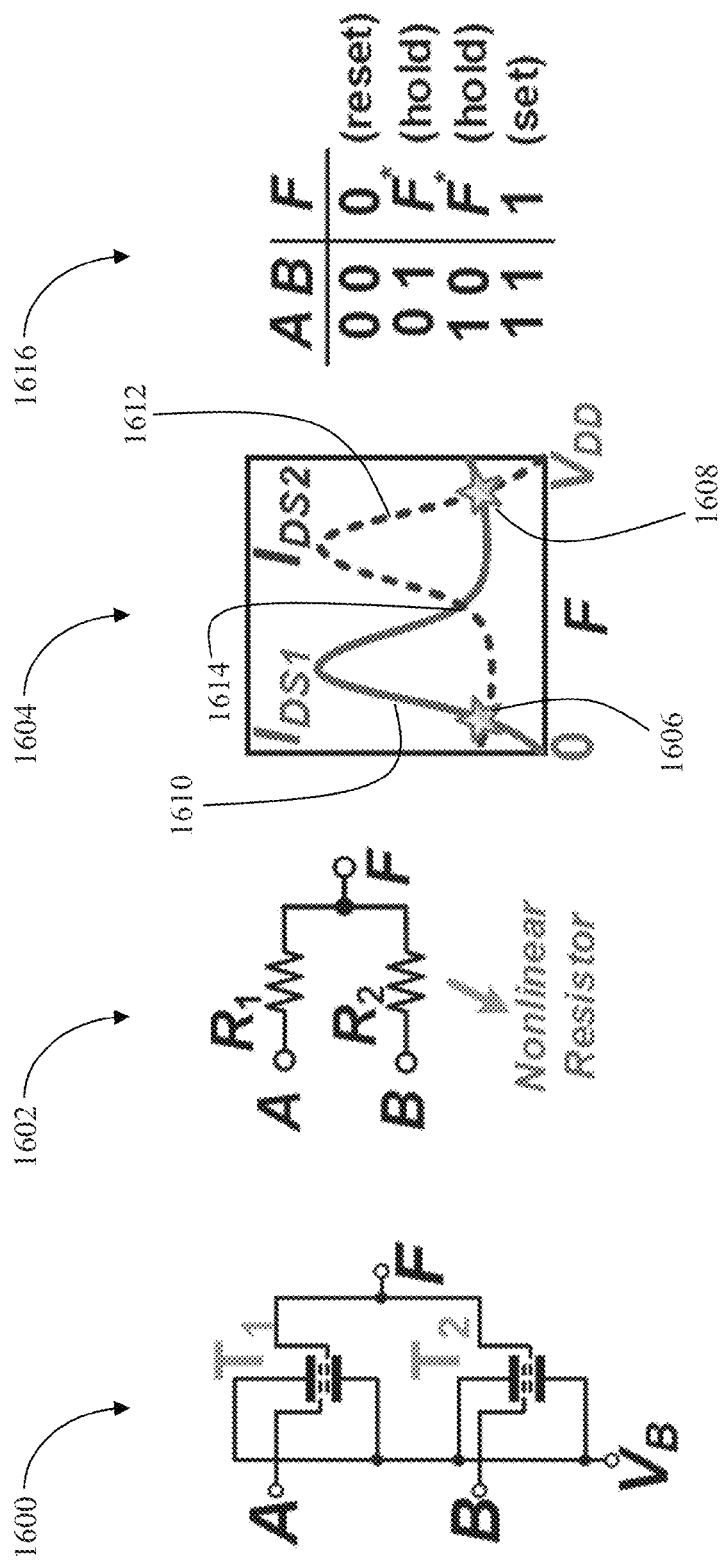
FIG. 16A is a circuit diagram of an example SymFET-based reset/set (RS) latch.
FIG. 16B is a model showing how two transistors of the example SymFET-based RS latch of FIG. 16A are being used.
FIG. 16C is a chart plotting the current through a first and second transistor $T_1$, $T_2$ of the example SymFET-based RS latch of FIG. 16A against output voltage when A=0 and B=$V_{DD}$.
FIG. 16D is a truth table of the example SymFET-based RS latch of FIG. 16A.

FIG. 16A shows an example SymFET-based reset/set (RS) latch 1600 that includes two-transistor circuits $T_1$ and $T_2$. Here, two SymFETs $T_1$ and $T_2$ are used like nonlinear resistors $R_1$ and $R_2$ as shown in a circuit 1602 of FIG. 16B. If inputs A and B in FIG. 16B have the same logic level, an output F will have the same level, independent of whether the resistors $R_1$ and $R_2$ are linear or nonlinear. If one input (e.g., A) is low and the other one (e.g., B) is high, the circuit 1602 is bistable and, as shown in a chart 1604 in FIG. 16C, has two stable quiescent points 1606, 1608. I-V curves 1610, 1612 of the two transistors $T_1$, $T_2$ have three intersections, one intersection 1614 of which is unstable because it lies on an NDR region of the I-V curves 1610, 1612. As a result, the output voltage F can be either low or high when one and only one of the two inputs A, B is high, and is determined by its previous state.

Figures 17A, 17B, 17C:
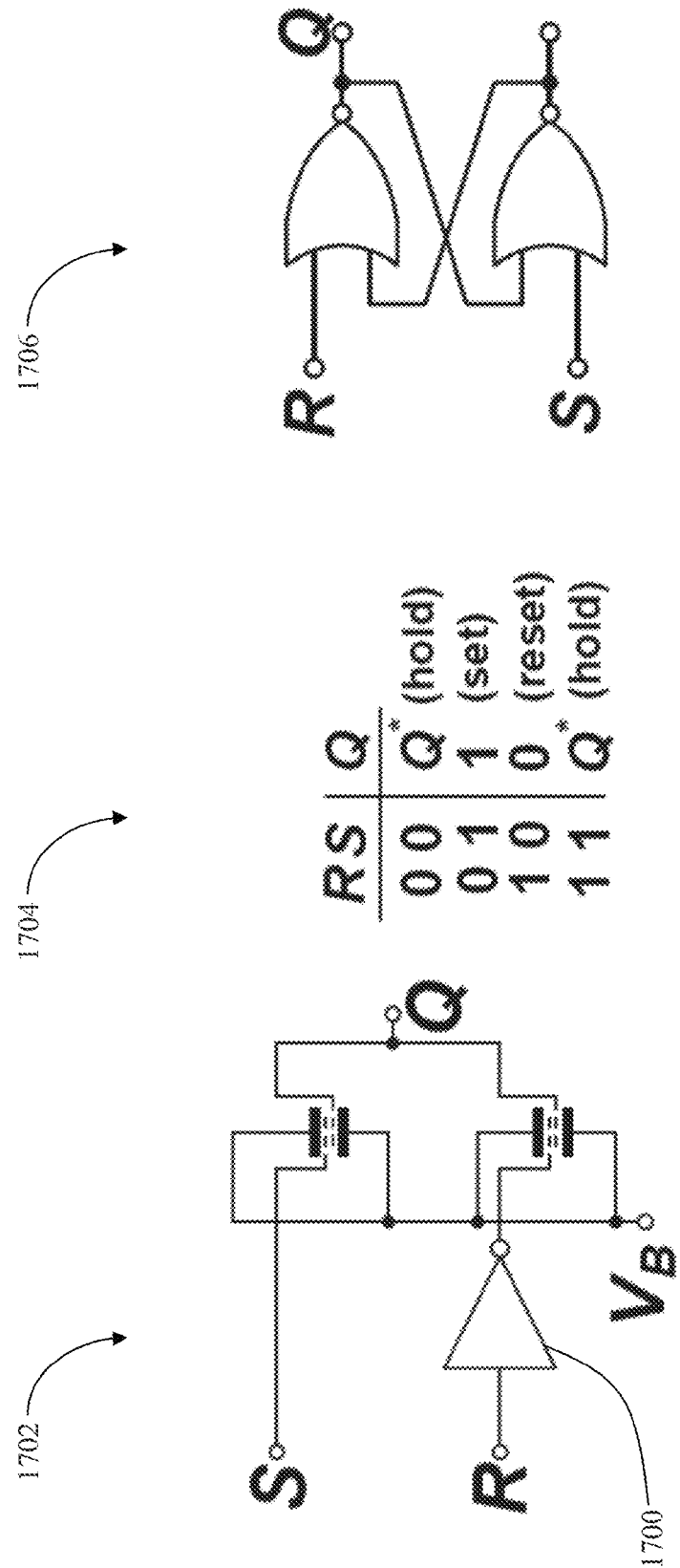
FIG. 17A is a circuit diagram of an RS latch with an inverter.
FIG. 17B is a truth table for the RS latch of FIG. 17A.
FIG. 17C is a circuit diagram for a conventional RS latch having eight transistors.

A truth table 1616 of the example SymFET-based RS latch 1600 is represented in FIG. 16D, where "F*" refers to the previous "F" value. The truth table 1616 of the SymFET-based RS latch 1600 resembles that of a latch. In fact, adding an inverter 1700 to the SymFET-based RS latch 1600 of FIG. 16A results in an RS latch 1702 as shown in FIG. 17A that is known in the art. A truth table 1704 corresponding to the RS latch 1702 is shown in FIG. 17B. In addition, FIG. 17C shows a conventional RS latch 1706, which has eight transistors. By way of comparison, the example SymFET-based RS latch 1600 has only four transistors. A simulated transient response 1800 of the example SymFET-based RS latch 1600 is shown in FIGS. 18A-18B, where a 10%-to-90% rise time is 0.8 ns.

Latch 2

Figures 19A, 19B:
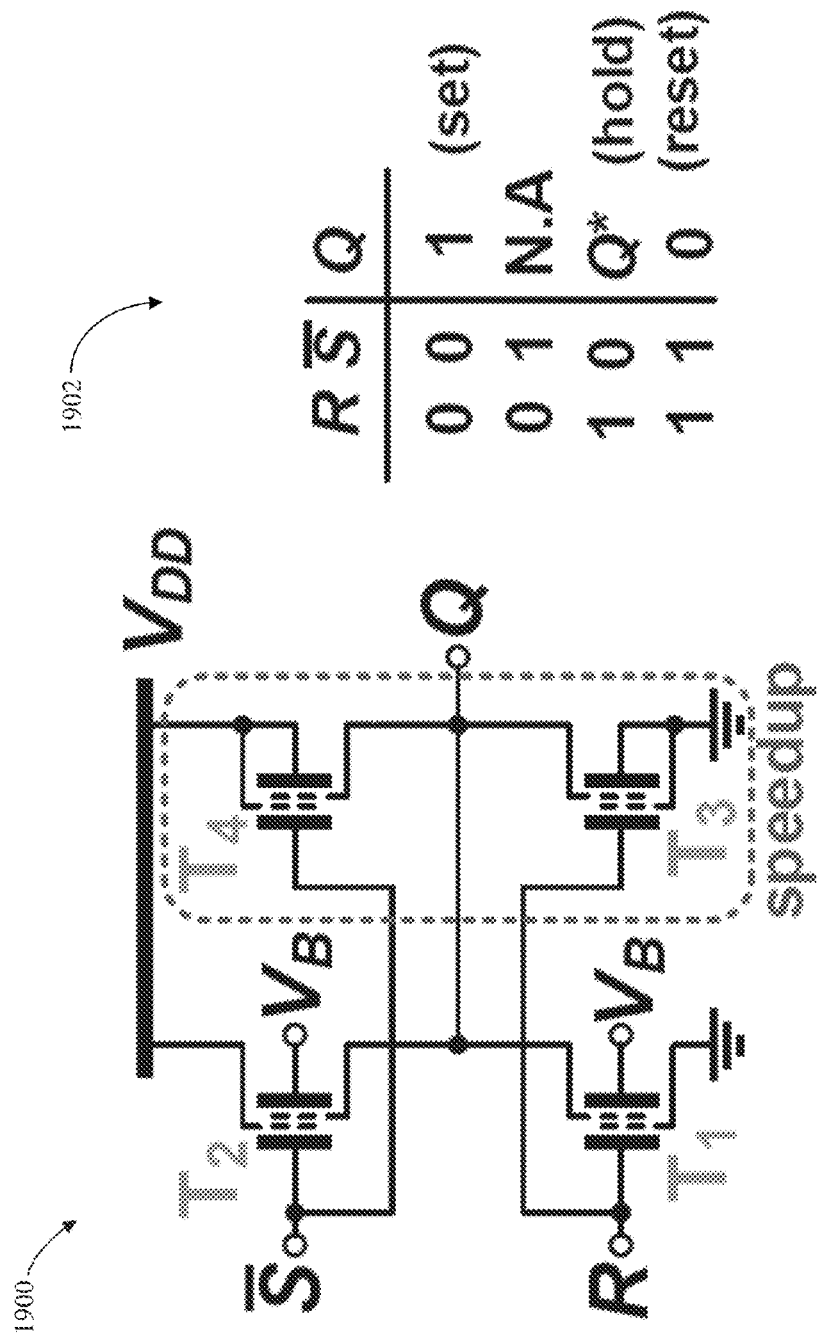
FIG. 19A is a circuit diagram of another example SymFET-based latch.
FIG. 19B is a truth table for the example SymFET-based latch of FIG. 19A.
Figures 19C, 19D, 19E:
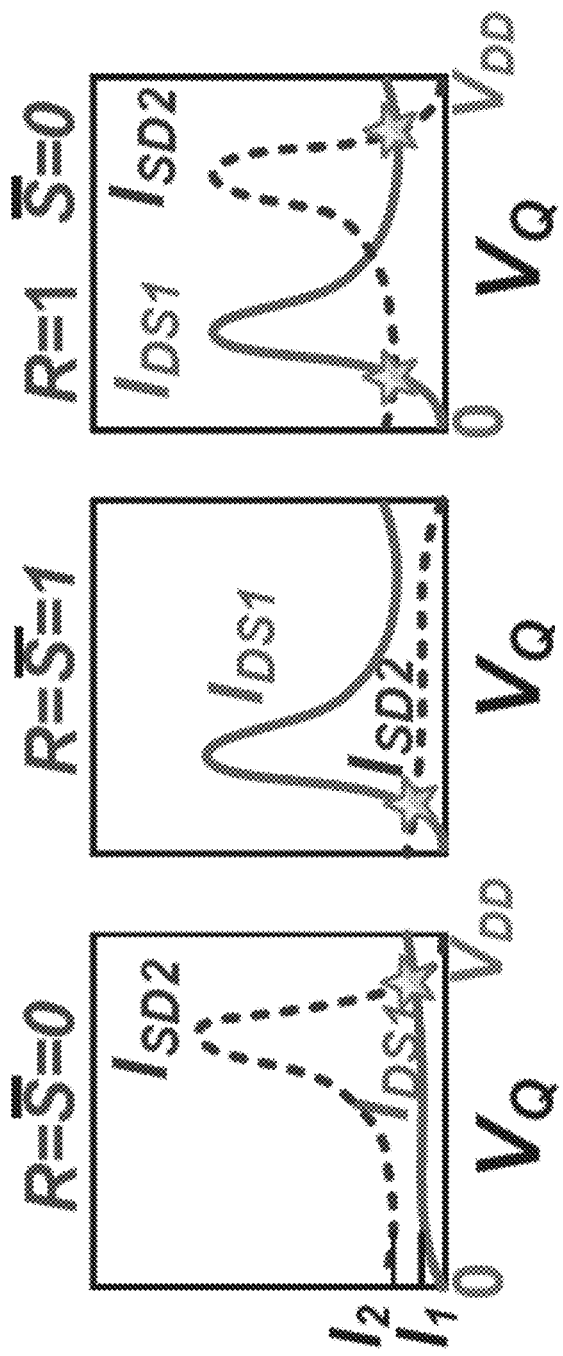
FIGS. 19C-19E together show several charts plotting current versus voltage at different input values for a latch without speedup transistors.

FIG. 19A shows another example SymFET-based latch 1900, with a corresponding truth table 1902 in FIG. 19B. First and second transistors $T_1$, $T_2$ form a core part of the example SymFET-based latch 1900, whereas third and fourth transistors $T_3$, $T_4$ are used primarily to speedup the example SymFET-based latch 1900. As shown in the truth table 1902, the SymFET-based latch 1900 has three valid input combinations, although a combination where R=0 and $\overline{S}$=1 is not allowed. Operation of the SymFET-based latch 1900 (without speedup) can be explained using FIGS. 19C-19E. For example, if R=$\overline{S}$=0, then the first transistor $T_1$ is off and the second transistor $T_2$ is on. Consequently, output capacitance is charged, and a final output voltage $V_Q$ is close to $V_{DD}$. Further, if R=1 and $\overline{S}$=0, the SymFET-based latch 1900 is bistable. Depending on the previous Q, the output voltage $V_Q$ can be either low or high.

FIGS. 20A-20C shows transient simulation results 2000 of the SymFET-based latch 1900 without the speedup transistors $T_3$, $T_4$. The transient simulation results 2000 reveal large rise and fall times. The reason behind the large rise and fall times is the small charge and discharge current. For instance, consider a case where output is initially low and then input is set to R=$\overline{S}$=0. The output capacitance must be charged, but the charging current (i.e., the difference between the currents of $T_1$ and $T_2$ ($I_2-I_1$ in FIGS. 19C-19E)) is small for a large range of output voltages.

Figures 21A, 21B, 21C:
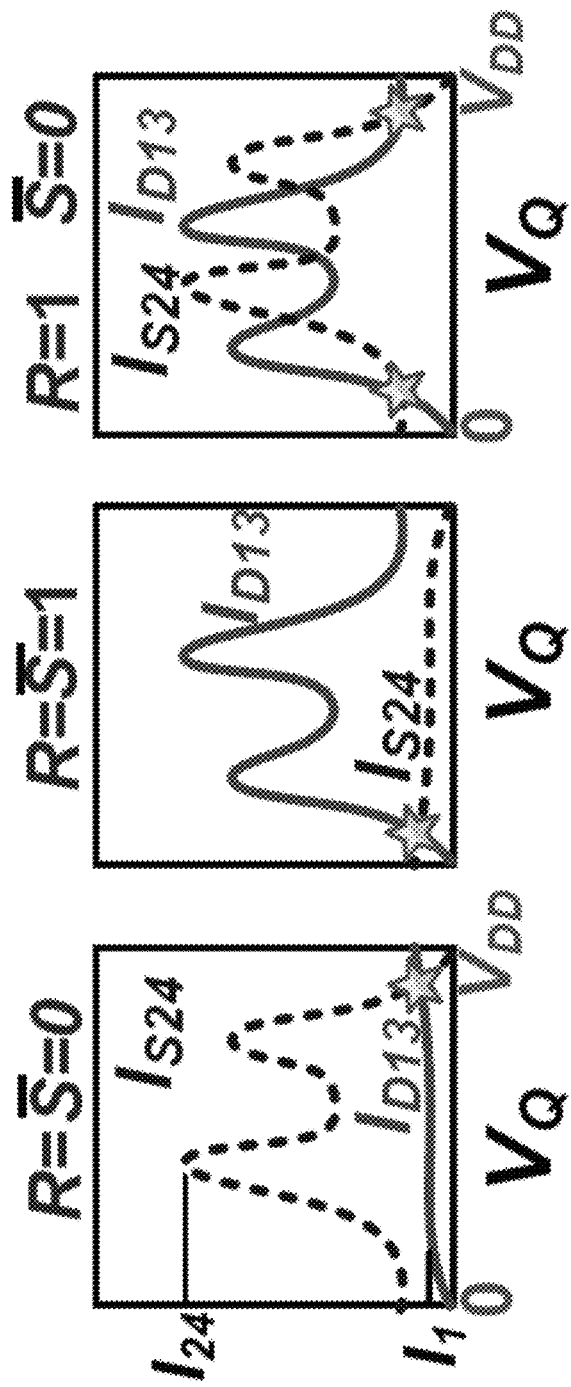
FIGS. 21A-21C together show the I-V curves of transistors from the example SymFET-based latch of FIG. 19A where $I_{D13}=I_{DS1}+I_{DS3}$ and $I_{S24}=I_{SD2}+I_{SD4}$.

To accelerate the transient response of the SymFET-based latch 1900, the third and fourth transistors $T_3$, $T_4$ are employed. In some examples, the BGs of the third and fourth transistors $T_3$, $T_4$ are connected to their respective source terminals, and therefore $V_{TG3}-V_{BG3}$ is larger than $V_{TG1}-V_{BG1}$ for high-level R. This shifts the peak current of an $I_{DS}-V_{DS}$ curve of the third transistor $T_3$ to a higher $V_{DS}$. The sum currents $I_{DS1}+I_{DS3}$ and $I_{SD2}+I_{SD4}$ will have two peaks, as shown in FIGS. 21A-21C. Comparing FIGS. 19C-19E (i.e., the I-V curve of the first and second transistors $T_1$ and $T_2$ with no speedup transistors) and FIGS. 21A-21C (i.e., the I-V curve of transistors where $I_{D13}=I_{DS1}+I_{DS3}$ and $I_{S24}=I_{SD2}+I_{SD4}$) shows that operation of the SymFET-based latch 1900 after adding the speedup transistors $T_3$, $T_4$ does not change in principle. The main difference is that charge and discharge currents will be higher. In the aforementioned example, wherein an output node was supposed to be charged, adding the fourth transistor $T_4$ increases the charging current from $I_2-I_1$ to $I_{24}-I_1$ at certain output voltages (i.e., $I_{24}=I_2+I_4$). On average, the charge current is significantly larger. The effect of speedup transistors can also been in FIGS. 20A-20C, where the rise time of the SymFET-based latch 1900 is reduced from 5.1 ns to 0.83 ns after adding speedup transistors.

Mobile DFF

Figure 22B:
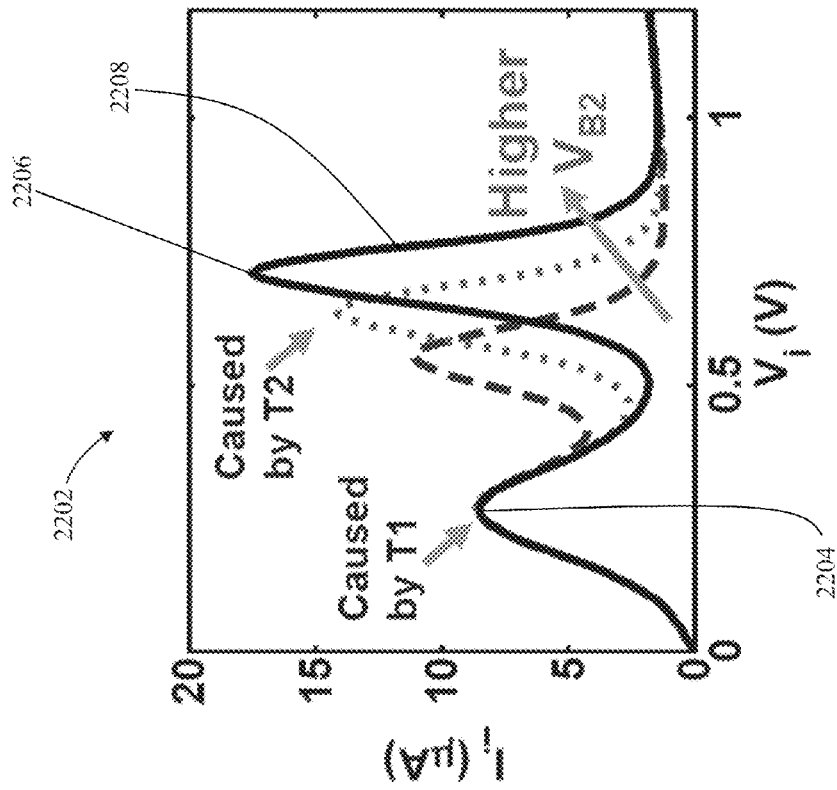
FIG. 22B is a chart plotting the sum of the currents in two SymFETs $T_1$, $T_2$ of the device of FIG. 22A against input voltage.
Figure 22A:
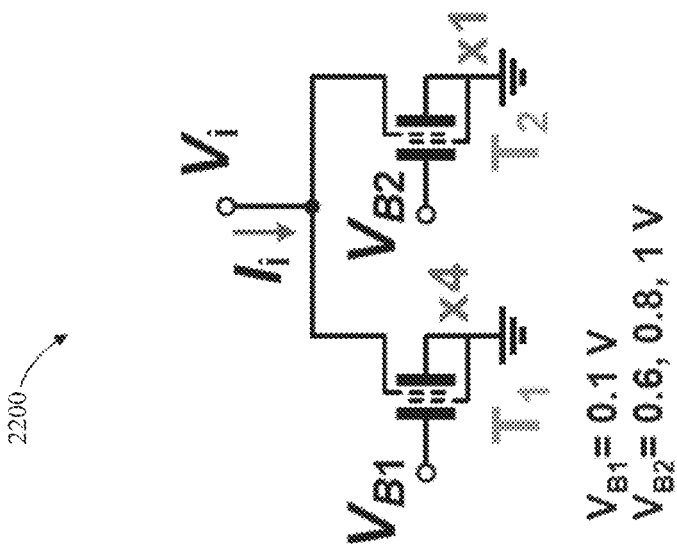
FIG. 22A is a circuit diagram of an RTD-like device based on SymFETs.

Furthermore, some features of SymFETs resemble that of resistance temperature detectors (RTDs), and SymFETs can achieve RTD-like behavior. FIG. 22A shows an example circuit 2200 built by placing two SymFETs $T_1$, $T_2$ in parallel. As such, the current passing through the circuit 2200 is the sum of the currents in the first and second SymFETs $T_1$, $T_2$. FIG. 22B shows a chart 2202 plotting input current $I_i$ against input voltage $V_i$. In this example, each of the transistors $T_1$, $T_2$ contributes to peaks 2204, 2206 in a total current 2208 and an N-shaped curve expected from an RTD is obtained for a properly designated voltage range. Those having ordinary skill in the art will appreciate that the shape of total current curve 2208 can be tuned by adjusting the bias voltages $V_{B1}$, $V_{B2}$ in the circuit 2200.

Figure 23A:
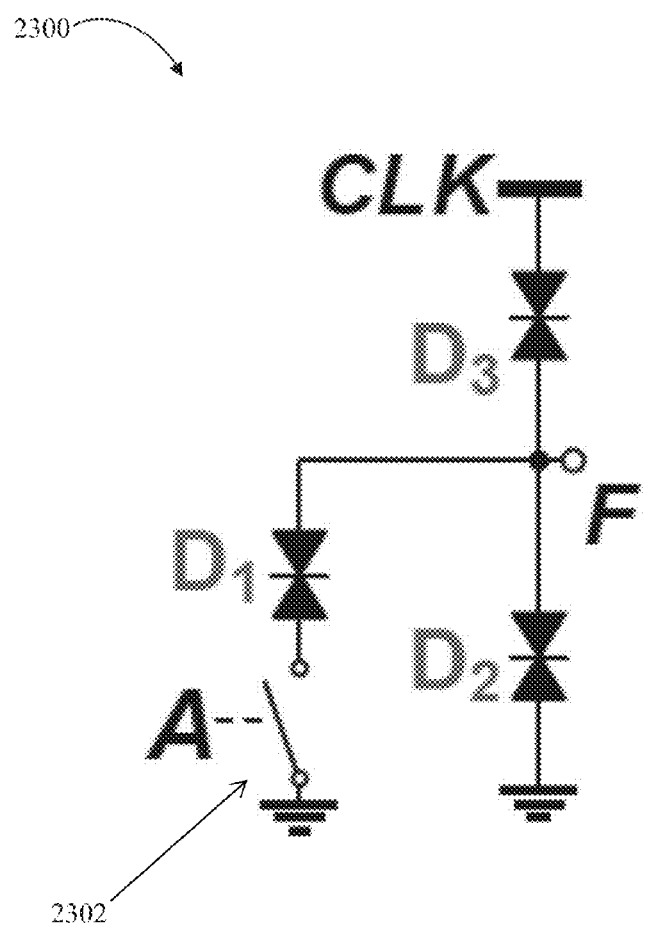
FIG. 23A is a circuit diagram of an RTD-based MOBILE inverter/DFF.

That said, there are still other ways to achieve this functionality without replacing an RTD with two SymFETs. By way of example, one of the most popular RTD-based logic elements is a monostable-bistable transition logic element (MOBILE). MOBILEs have a self-latching property. For instance, a circuit 2300 shown in FIG. 23 works both as an inverter and as an edge-triggered flip-flop (DFF). The example circuit 2300 includes a switch 2302, implemented by a transistor, and three RTDs $D_1$, $D_2$, and $D_3$, which should be properly sized such that their peak currents satisfy the following conditions:

$$I_{pk2} < I_{pk3} \text{ and } I_{pk1} + I_{pk2} > I_{pk3}.$$

Figures 23B, 23C, 23D:
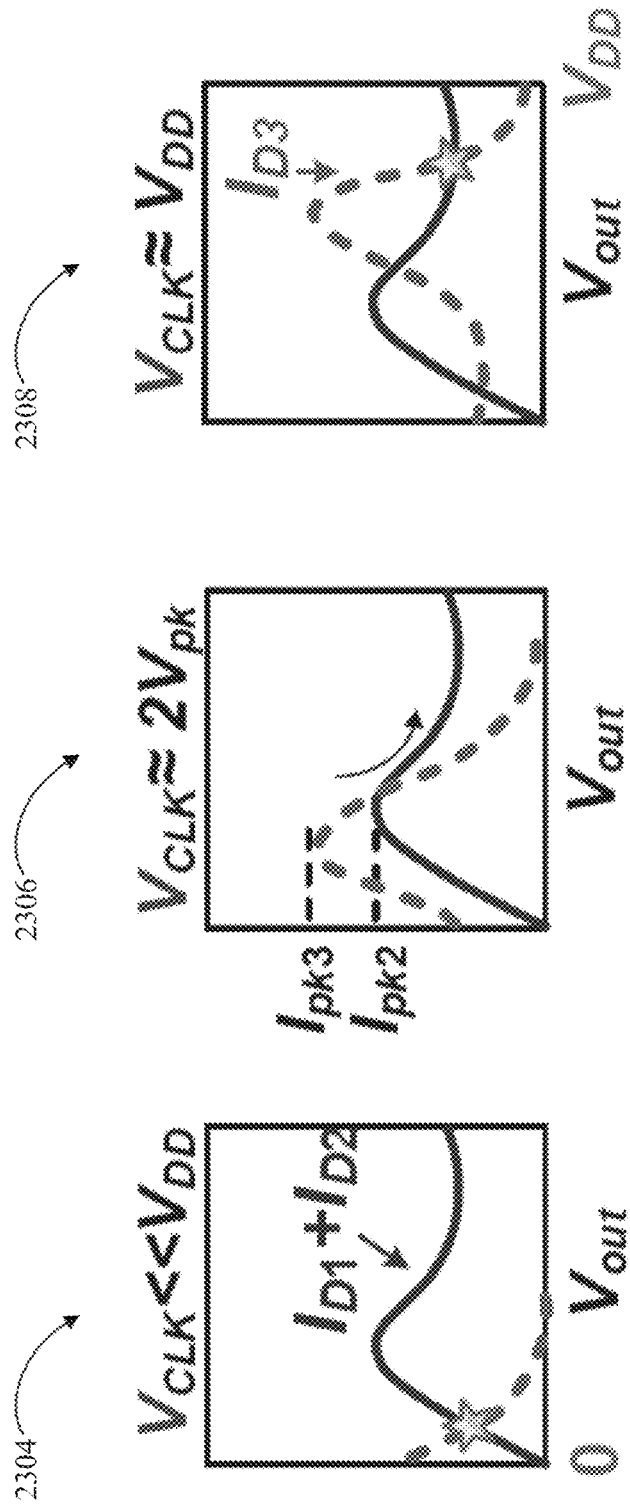
FIGS. 23B-23D show several charts plotting current versus output voltage for a low A input as a clocked input gradually increases.

In this example, operation of the circuit 2300 relies heavily on NDR regions of the three RTDs $D_1$, $D_2$, and $D_3$, as reflected in charts 2304, 2306, 2308 of FIGS. 23B-23D. When a clock input CLK is a small voltage, the circuit 2300 is monostable and an output F is low. As the clock input CLK increases (e.g., from much less than $V_{DD}$ to $2 \times V_{pk}$ to $V_{DD}$ shown in FIGS. 23B-23D), a driving current curve ($I_{D1}+I_{D2}$) will intersect with a load current curve ($I_{D3}$) in an NDR region, resulting in metastability. When the clock input CLK becomes high enough, the output reaches one of two stable points. The example shown in FIGS. 23B-23D corresponds to a low A (e.g., $I_{D1}=0$) and a high final output voltage.

Figures 24A, 24B, 24C:
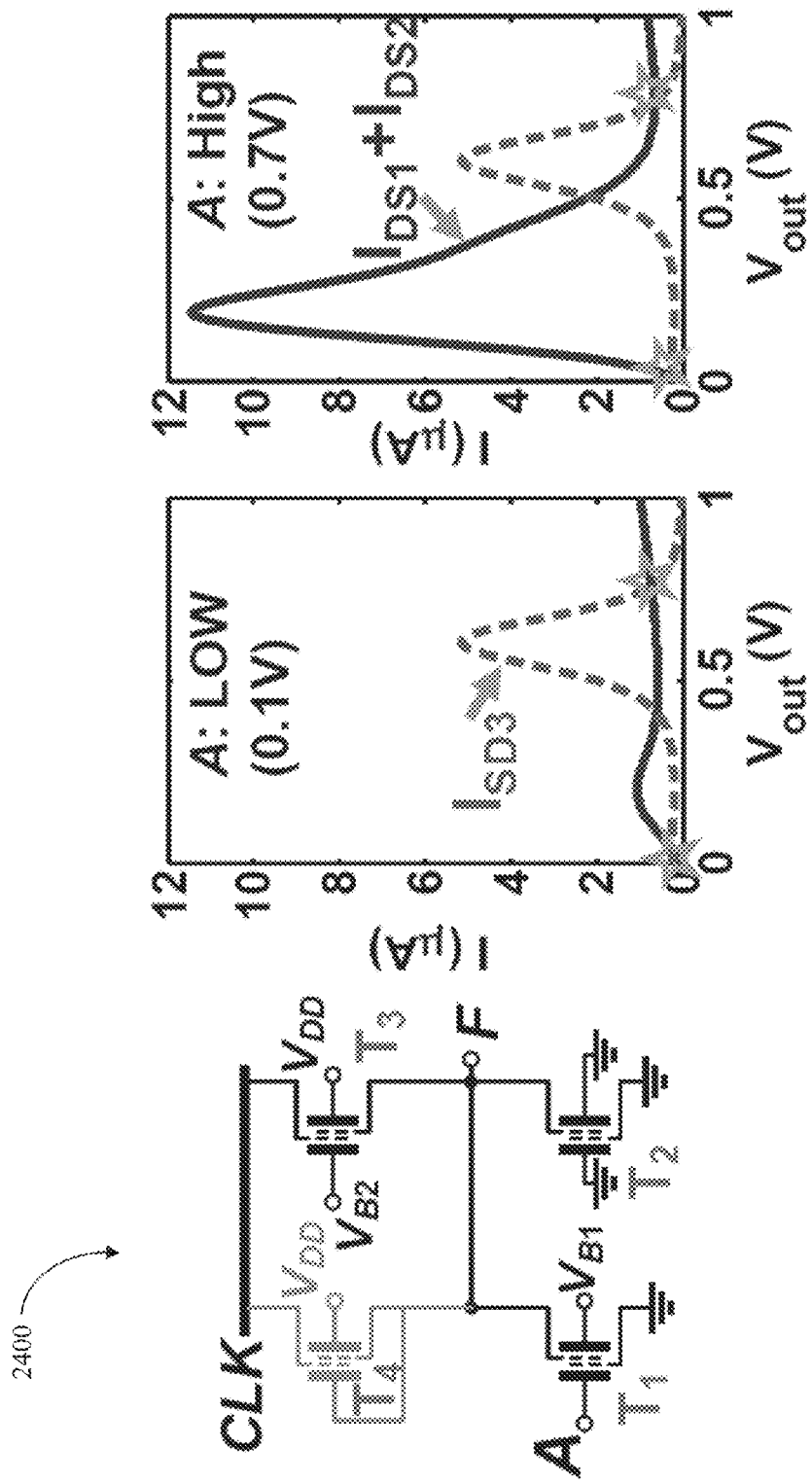
FIG. 24A is a circuit diagram of an example SymFET-based MOBILE device.
FIG. 24B is a chart plotting input through the SymFETs against output voltage of the SymFET-based MOBILE device of FIG. 24A for a high clock input.
FIG. 24C is a chart similar to FIG. 24B, but shows a combined current of $I_{DS1}+I_{DS2}$.

Still further, an example SymFET-based MOBILE 2400 is shown in FIG. 24A. A first SymFET $T_1$ acts as both the switch A and the first RTD $D_1$ from FIG. 23A. Moreover, a fourth SymFET $T_4$ may be omitted in some examples, but utilized in others. The fourth SymFET T4 helps to discharge the output faster when a clock input CLK switches from high to low. Proper operation of the example SymFET-based MOBILE circuit 2400 depends on sizing of the first, second, and third SymFETs $T_1$, $T_2$, $T_3$ as well as bias voltages ($V_{B1-2}$). In some examples, there are many ways to satisfy the conditions that $I_{pk2}<I_{pk3}$ and that $I_{pk1}+I_{pk2}>I_{pk3}$. In the example SymFET-based MOBILE 2400 here, the second and third SymFETs $T_2$, $T_3$ are minimum-size transistors, while in other examples they may be larger. Nonetheless, when input is low, $I_{DS1}$ is negligible. $V_{DD}-V_{B2}$ is positive (0.3 V), but the gate voltages of the second SymFET $T_2$ are both grounded. This insures that a peak current of the second SymFET $T_2$ is smaller than that of the third SymFET $T_3$ as desired ($I_{pk2}<I_{pk3}$). Further, $V_{B1}$ is selected to be $V_{IH}-0.3$ V so that the gate differential of $T_1$ and $T_3$ are equal, when input is high. The size of the second SymFET $T_2$ is twice that of the first SymFET $T_1$ and, therefore, a peak current of the second SymFET $T_2$ is higher than that of the third SymFET $T_3$. This in turn insures that a high-level input will result in a low-level output. FIGS. 24B and 24C show current through the SymFETs of the MOBILE circuit 2400 for a high clock input CLK (e.g., equal to $V_{DD}=1$ V). The SymFET-based MOBILE circuit 2400 is bistable for both input logic levels.

Figures 24D, 24E, 24F:
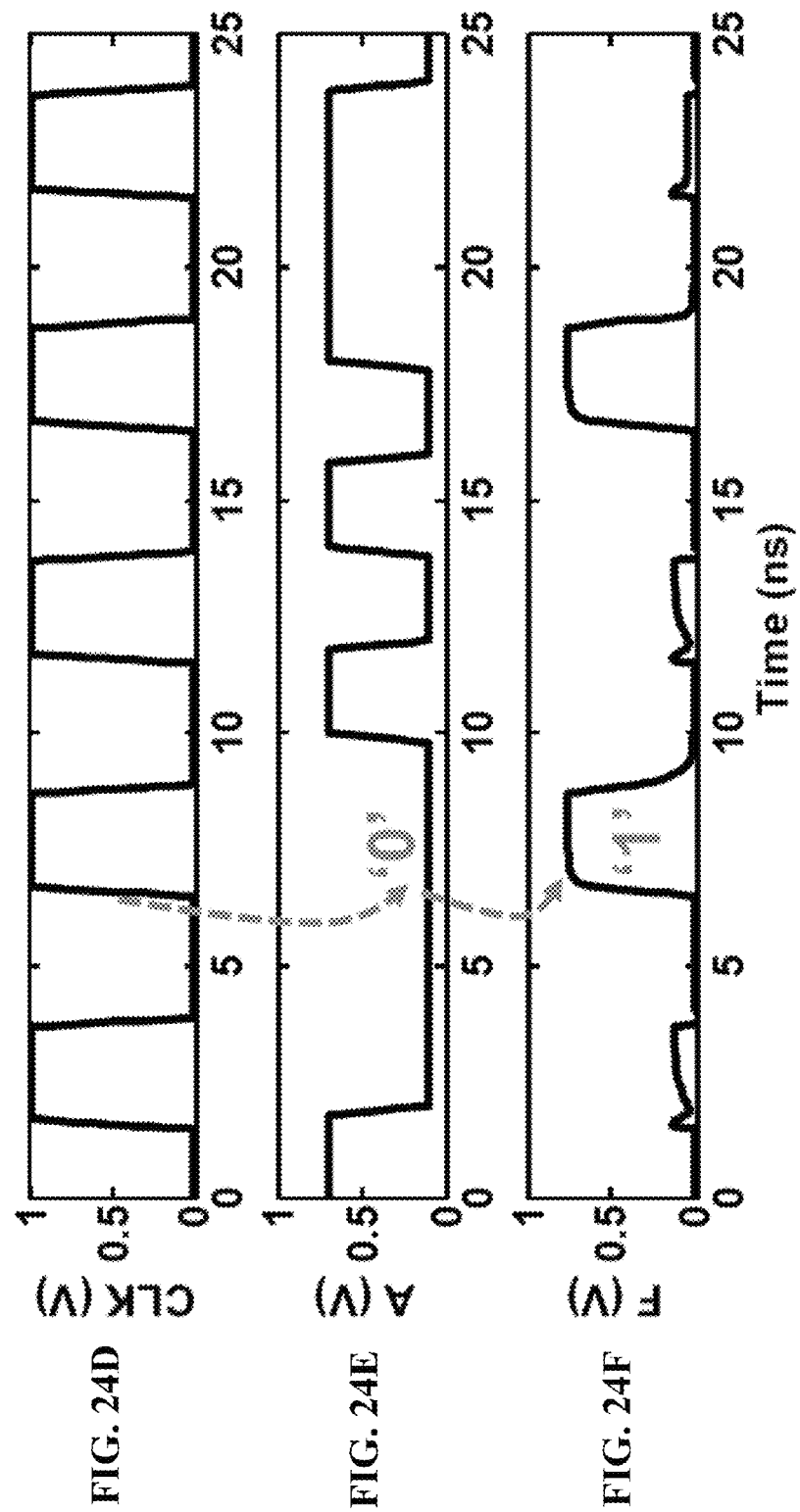
FIGS. 24D-24F together show input/output waveforms of the example MOBILE circuit of FIG. 24A showing that the output F is high only if input A is low at the rising edge of the clocked input.

With reference now to FIGS. 24D-24F, input/output waveforms 2402 of the example MOBILE circuit 2400 are shown. Input levels have been selected to be 0.1 V and 0.7 V, similar to worst-case output levels. Those having ordinary skill in the art will understand that altering A does not change the output, even when the clock input CLK is high.

Benchmarking

The quantitative performance of the aforementioned example SymFET-based gates was evaluated using SPICE simulations. As shown below, Table I compares the metrics of several inverters and buffers in terms of peak-to-peak output swing ($V_{o,pp}$), propagation delay ($T_{pd}$), average dynamic energy per output switching ($E_{DYN}$), and static power dissipation ($P_{STAT}$).

TABLE I

PERFORMANCE OF INVERTERS/BUFFERS

Figures 8A, 8B:
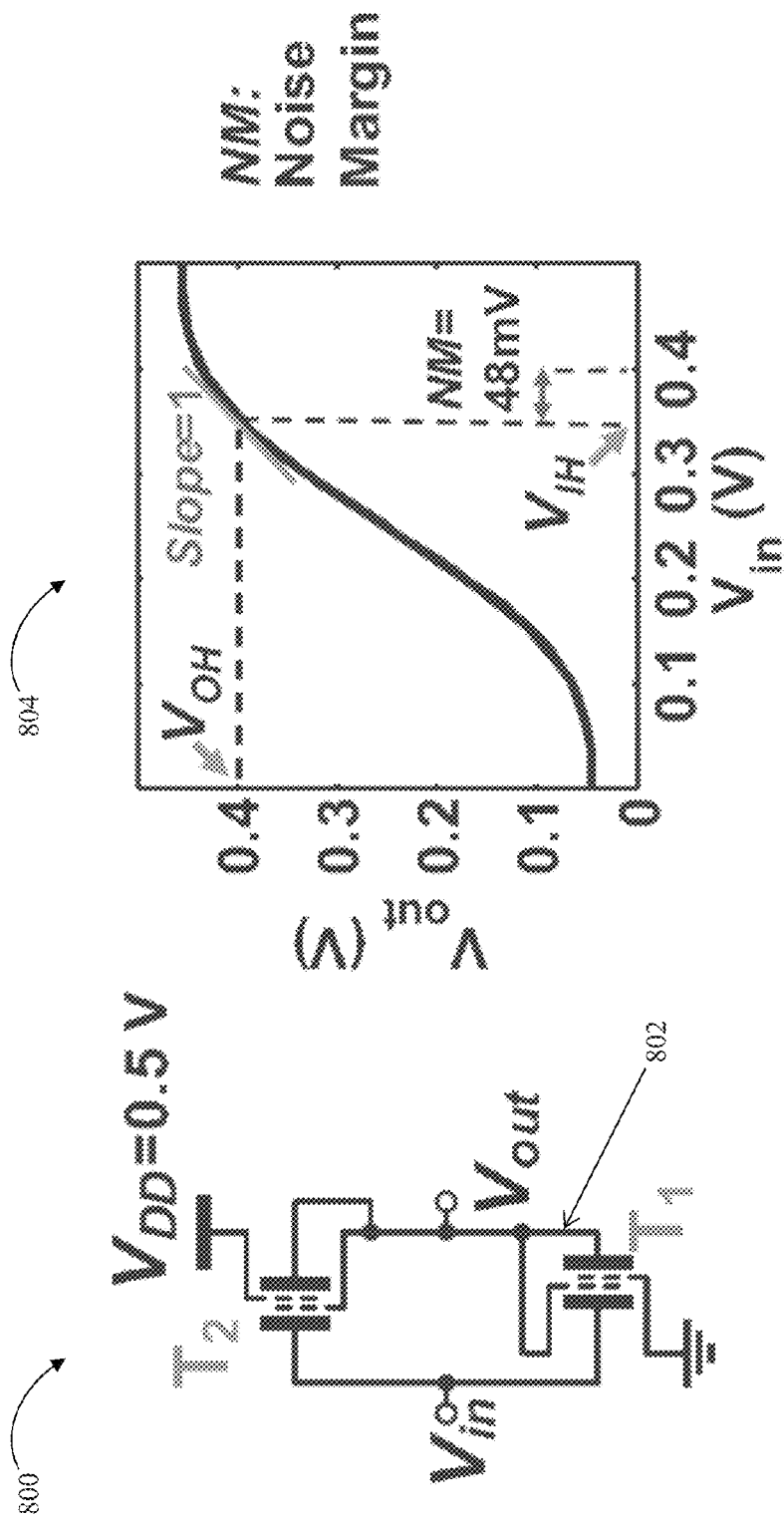
FIG. 8A is a circuit diagram of another example SymFET-based buffer designed to eliminate or at least minimize hysteresis.
FIG. 8B is a chart plotting voltage out against voltage in for the example SymFET-based buffer of FIG. 8A.

| Circuit | $V_{o,pp}$ (V) | $T_{pd}$ (ns) | $T_{rise}$, $T_{fall}$ (ns) | $E_{DYN}$ (fJ) | $P_{STAT}$ (nW) |
|---|---|---|---|---|---|
| Inv. FIG 3A | 0.25 | 0.28 | 0.64 | 0.13 | 71 |
| Inv. FIG. 6A | 0.19 | 0.32 | 0.61 | 0.1 | 45 |
| Buf. FIG 7A | 0.17 | 0.20 | 1.3 | 0.08 | 68 |
| Buf. FIG. 8A | 0.13 | 0.13 | 0.85 | 0.03 | 120 |
| Inv. FIG. 9D* | 0.23 | 0.91 | 1.5, 0.83 | 0.15 | 68 |
| Inv. FIG. 9A* | 0.22 | 0.29† | 0.7, 0.57 | 0.12/.07‡ | 62 |

*without T2.
†from CLK to F (from A to F for others).
‡depends on capability of CLK to absorb power (see the text).
Note:
all simulations are done with a FO4 inverter of FIG. 3A as driver and load of the gate under test at $V_{DD}=0.3$ V (= high level of CLK). Rise/fall times ($T_{rise}$, $T_{fall}$) are measured from 10% to 90% of the output levels.

Some of the example gates have a smaller output swing (and hence a smaller noise margin), which results in lower dynamic energy dissipation. As in CMOS designs, each gate might be suitable for a certain application. For example, the example inverter of FIG. 9 has a larger delay compared with that in FIG. 3A, but also has a smaller input capacitance. In another example, the clocked inverter of FIG. 10A might be viewed as an adiabatic circuit. That is, when the clocked input CLK goes low, the charge stored at the output node F will return back to the value at the clock input CLK node. Depending on whether the clock input CLK generator circuitry is capable of absorbing this charge or simply directs it to ground, two different dynamic energy values are provided in Table I.

In Table II, the performances of three example SymFET-based adders based on conventional topology (mirror adder), a dynamic pseudo-SymFET design, and a MAJORITY gate are compared.

TABLE II

PERFORMANCE OF 1-BIT SYMFET-BASED FULL-ADDERS

| | $T_{pd}$ (ns) | $E_{DYN}$ (fJ) | $P_{STAT}$ (µW) | $P_{TOT}$ (µW) | PDP (fJ) | Area* (µm²) |
|---|---|---|---|---|---|---|
| Conventional (0.3 V) | 1.4 | 0.4 | 0.64 | 0.72 | 1.0 | 0.64 |
| Dyn. pseudo-Sym. (0.4 V) | 1.1 | 0.95 | 0.61 | 0.8 | 0.88 | 0.49 |
| Majority (0.4 V) | 0.65 | 0.37 | 1.1 | 1.2 | 0.78 | 0.42 |

*assuming total area (including wirings) is twice the area of transistors.
Note:
In SPICE simulation, a 100 MHz signal is applied to A while B is Low and $C_i$ is High. The adder is cascaded with a similar one.

For the purposes of Table II, a slightly higher supply voltage is used for the MAJORITY-based adder in order to have the same output swing in both circuits. The MAJORITY-based adder has a better power-delay product (PDP) and occupies less area, but has higher static power dissipation. Those having ordinary skill in the art will recognize that at this test frequency (i.e., 100 MHz), the power dissipation is dominated by leakage.

Likewise, it is informative to benchmark the performance of SymFET technologies against CMOS technologies. Due to the different structure of the SymFET, it is non-trivial to select a certain CMOS technology node for a comparison. In the examples that follow, a 100-nm SymFET device is compared with 90-nm and 130-nm CMOS technologies. According to a manual of several standard cell libraries for said technologies, the dynamic energy of the minimum-size inverter and full-adder cell are, respectively, 4 to 6 fJ and 10 to 20 fJ. The dynamic energy of a CMOS DFF is 20 to 30 fJ. Compared with the $E_{DYN}$ in Tables I, II, and IV, the SymFET-based circuits are approximately one order of magnitude more energy efficient. This is especially impressive for the MOBILE DFF, which has a delay close to those given for standard cell DFFs (around 0.1 ns). However, in some examples, the leakage of CMOS standard cells is smaller (in sub-nW range for low-leakage CMOS).

Figures 25A, 25B:
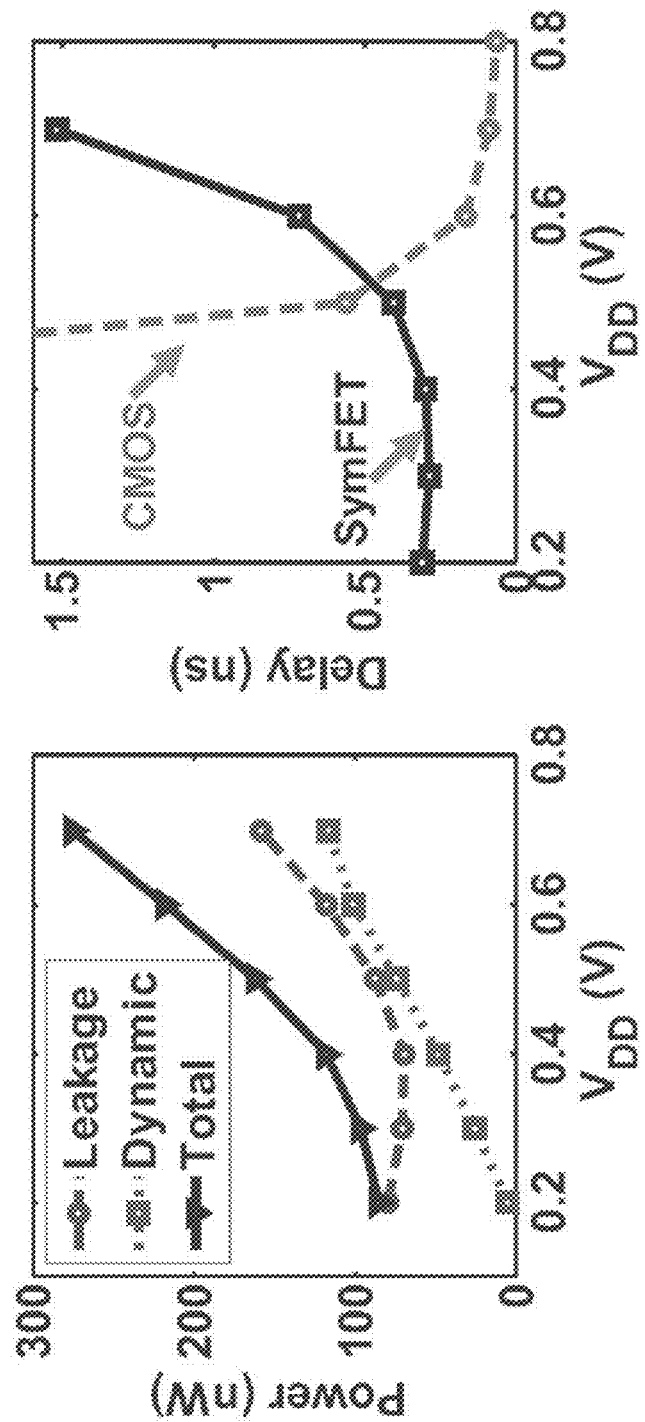
FIG. 25A is a chart showing power dissipation of a SymFET-based inverter at 100 MHz with an FO4 inverter as load.
FIG. 25B is a chart showing the propagation delay of a SymFET-based inverter measured from 50% input to 50% output.
Figures 25C, 25D:
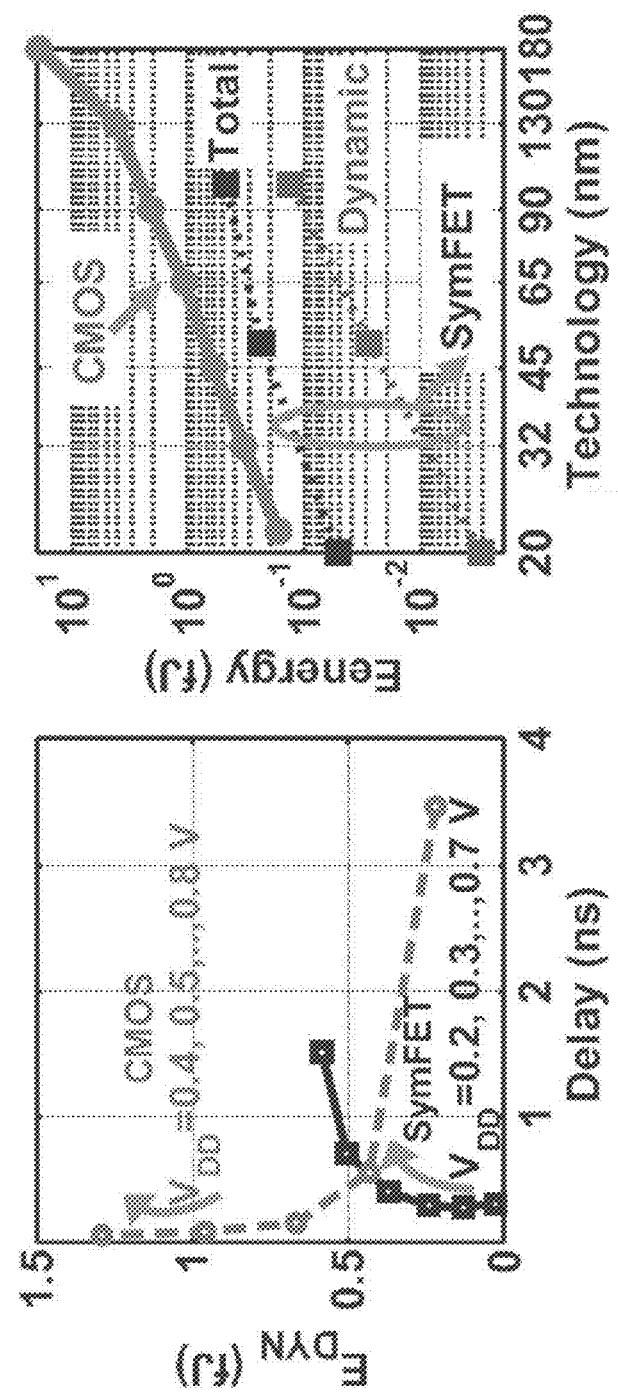
FIG. 25C is a chart illustrating the delay-energy relationship at different supply voltages.
FIG. 25D is a chart showing energy dissipation of SymFET-based inverters (squares) in comparison with that of CMOS-based inverters at 100 MHz.

Moreover, an inverter of FIG. 3A was used as a basis for further comparison. The results shown in FIG. 25 involve a 100-nm SymFET device and a 130 nm CMOS device. All results belong to a minimum-size inverter that is both driven and loaded with FO4 inverters. More particularly, FIG. 25A shows power dissipation of a SymFET-based inverter. The dynamic power dissipation rapidly changes with supply (cf., $CV^2$). In this example, a relationship appears between propagation delay of the SymFET-based gate and $V_{DD}$, shown in FIG. 25B, which is quite different than the behavior of CMOS inverters. An explanation follows with reference back to FIG. 2. If $V_{DD}$ (and consequently the gate voltage of the transistor) is large, the peak in the $I_{DS}$ curve is pushed to higher $V_{DS}$ values. This means that for a large $V_{DD}$, the current drive capability of the SymFET-based inverter is relatively small in a large output voltage range and the gate becomes slow. FIG. 25C shows both delay and energy at different supply voltages. In this example, the SymFET has a better performance-energy tradeoff, if the desired delay is not demanding.

Next, the performance of the inverters is compared at several technology nodes. The data for CMOS is from A. Stillmaker et al., "Toward more accurate scaling estimates of CMOS circuits from 180 nm to 22 nm," Technical Report ECE VCL 2011 4 VLSI Computation Lab, Univ. of Cali., Davis, http://www.ece.ucdavis.edu/vcl/pubs, which is hereby incorporated by reference in its entirety. The SymFET dimensions and other properties are given in Table III, wherein EOT is also reduced with device dimension to enhance the electrostatic control of the gates.

TABLE III

SYMFET SCALING

| Dimensions | Gate Oxide | $V_{DD}$ | Inverter delay |
|---|---|---|---|
| 100 nm-by-100 nm | EOT = 1.2 nm | 0.3 V | 0.28 ns |
| 50 nm-by-50 nm | EOT = 1.0 nm | 0.36 V | 0.49 ns |
| 20 nm-by-20 nm | EOT = 0.7 nm | 0.49 V | 1.2 ns |

As the SymFET area is reduced, its characteristic changes somewhat (off-current increases). To keep the voltage swings in a practical range (i.e., >0.25 V), the supply voltage (Table III) was increased. When compared with the CMOS device in FIG. 25D, the SymFET exhibits more than an order of magnitude improvement in dynamic energy. One having ordinary skill in the art will recognize that if operation frequency increases, the impact of leakage in total energy will be reduced and "Total" energy points will move toward "Dynamic" energy points. However, it is also possible to reduce the dynamic energy dissipation of CMOS gates by an order of magnitude by lowering VDD by a factor of 3.1, where the resulting VDD of 0.3 to 0.4 V would make their delay larger than that of the SymFET gates (see FIG. 25C). Consequently, SymFETs prove more energy efficient than CMOS at least when clock frequencies of a few hundred MHz and delays on the order of few tenths of nanoseconds are desired.

What's more, FIG. 25D indicates that dynamic energy of the SymFET scales rapidly with device dimension. When the SymFET is scaled by $\lambda$ (<1), its area and hence both capacitance and current drive are reduced by two. Energy and delay are scaled as $$E_{DYN}(\alpha C_L V_{SW} V_{DD}) \xrightarrow{scaled} \lambda^2 E_{DYN}$$

$$T_{pd}\left(\alpha \frac{C_L V_{SW}}{I_{ON} - I_{OFF}}\right) \xrightarrow{scaled} T_{pd}$$

where $C_L$ is the load capacitance, $V_{SW}$ is the output swing, and $I_{ON}$ and $I_{OFF}$ are the on-current and off-current of the transistor. The above equation suggests that delay will not be scaled with technology. Table III shows that simulated $T_{ps}$ increases with scaling. This is a consequence of higher gate capacitance, which is inversely proportional to EOT, and also lower $I_{ON}-I_{OFF}$ attributable to the higher off-current.

Yet another tool can be used to modify the performance of the SymFETs and trade off delay with leakage, namely, the thickness of the tunneling barrier. In some examples, 1.34 nm BN was used as discussed in L. Britnell et al., "Field-effect tunneling transistor based on vertical graphene heterostructures," Science, vol. 335, no. 6071, pp. 947-950, February 2012, which is hereby incorporate by reference in its entirety.

Further, if fabrication technology and breakdown voltage of the insulator allow for a thinner barrier, tunneling current will substantially increase. For instance, if barrier thickness is reduced to 0.67 nm (i.e., 2 layers of BN), then delay of the inverter will be reduced by at least 10,000 times, even though the leakage current may increase proportionally.

Similar to Tables I and II above, the performance of SymFET latch and MOBILE DFF devices were also evaluated, as shown in Table IV below.

TABLE IV

PEFORMANCE OF INVERTERS/BUFFERS

| | $V_{DD}$ (V) | $V_{o,pp}$ (V) | $T_{pd}$ (ns) | $E_{DYN}$ (fJ) | $P_{STAT}$ (nW) |
|---|---|---|---|---|---|
| RS Latch FIG. 17A | 0.5 | >0.4 | 0.41 | 0.5 | 270 |
| Latch FIG. 19A | 1 | 0.84 | 1.8 | 2 | 640 |
| Inv./DFF FIG. 24A | 1* | 0.71 | 0.06 | 2.9/0.71† | 480 |

*high level of CLK.
†depends on capability of CLK to absorb power (see the text).
Note:
all simulations are done with a FO4 inverter of FIG. 3A as load.

Therefore, several new topologies for circuit design involving SymFETs have proven that they can offer low transistor count and low dynamic power dissipation. More specifically, SymFET-based inverters provide a lower switching energy compared with the iso-delay CMOS-based circuits, due in large part to their low operating supply voltage.

Although certain example devices have been described herein, the scope of coverage of this patent is not limited thereto. On the contrary, this patent covers all devices, methods, apparatus, systems, and articles of manufacture fairly falling within the scope of the appended claims either literally or under the doctrine of equivalents.

We claim:

1. A Boolean logic device comprising:
at least two SymFETs, with each of the at least two SymFETs including a top gate, a back gate, an insulator, a first graphene layer, a second graphene layer, a first oxide layer, and a second oxide layer, the insulator being disposed between the first and second graphene layers, the first and second graphene layers being disposed between the first and second oxide layers, the first and second oxide layers being disposed between the top and back gates, wherein conductivity of each of the at least two SymFETs is controlled at least in part by a first voltage supplied to the top gate and a second voltage supplied to the back gate;
wherein the at least two SymFETs are configured in at least one of a parallel or series circuit arrangement such that input voltage is transformed to an output voltage.

2. A Boolean logic device of claim 1, wherein the circuit inverts the input voltage and the circuit is bistable for at least one non-zero value of the input voltage.

3. A Boolean logic device of claim 2, further comprising:
an electrical drain in electrical communication with a first of the at least two SymFETs; and
a feedback loop disposed between the electrical drain and the back gate of the first of the at least two SymFETs.

4. A Boolean logic device of claim 1 wherein the at least two SymFETs define a first SymFET and a second SymFET, the Boolean logic device further comprising:
a third SymFET and a fourth SymFET, with the third and fourth SymFETs including a top gate, a back gate, an insulator, a first graphene layer, a second graphene layer, a first oxide layer, and a second oxide layer, the insulator being disposed between the first and second graphene layers, the first and second graphene layers being disposed between the first and second oxide layers, the first and second oxide layers being disposed between the top and back gates, wherein conductivities of the first and second SymFETs are controlled at least in part by a first voltage, wherein conductivities of the third and fourth SymFETs are controlled at least in part by a second voltage;

wherein the first, second, third, and fourth SymFETs are configured in a circuit such that the output voltage is false only if the first and second voltages are true.

5. A Boolean logic device of claim 1 wherein the at least two SymFETs define a first SymFET and a second SymFET, the Boolean logic device further comprising:

a third SymFET including a top gate, a back gate, an insulator, a first graphene layer, a second graphene layer, a first oxide layer, and a second oxide layer, the insulator being disposed between the first and second graphene layers, the first and second graphene layers being disposed between the first and second oxide layers, the first and second oxide layers being disposed between the top and back gates, wherein conductivity of the first SymFET is controlled at least in part by a first voltage, wherein conductivity of the second SymFET is controlled at least in part by a second voltage;

wherein the first, second, and third SymFETs are configured in a circuit such that the output voltage is true only if both the first and second voltages are false.

6. A Boolean logic device of claim 5, further comprising a clocked input.

7. A Boolean logic device of claim 1 wherein the at least two SymFETs define a first SymFET and a second SymFET, the Boolean logic device further comprising:

a first voltage source applying a first voltage to the top gates of the first and second transistors; and a source terminal applying a second voltage, the source terminal coupled to the first SymFET, wherein an output of the circuit is false only if the first voltage is true and the second voltage is false.

8. A Boolean logic device of claim 1 wherein the at least two SymFETs define a first SymFET and a second SymFET, the Boolean logic device further comprising:

a third SymFET and a fourth SymFET, with the third and fourth SymFETs including a top gate, a back gate, an insulator, a first graphene layer, a second graphene layer, a first oxide layer, and a second oxide layer, the insulator being disposed between the first and second graphene layers, the first and second graphene layers being disposed between the first and second oxide layers, the first and second oxide layers being disposed between the top and back gates, wherein the first and second SymFETs are in parallel, wherein the fourth SymFET is in series with the second SymFET, wherein the third SymFET is in series with the first SymFET, wherein the input voltage is supplied to the top gates of the second SymFET and the fourth SymFET and a bias voltage is supplied to the back gates of the first and second SymFETs, wherein a second input voltage is supplied to the top gates of the first and third SymFETs, wherein a drain voltage is coupled to the second and fourth SymFETs, wherein the first and third SymFETs are grounded, wherein the back gate of the third SymFET is grounded, wherein the back gate of the fourth SymFET is supplied with the drain voltage, wherein a first conductor extends between the first and second SymFETs and a second conductor extends between the third and fourth SymFETS, wherein the first and second conductors are coupled to one another at which point the output voltage is measured.

9. A Boolean logic device of claim 1 wherein the at least two SymFETs define a first SymFET and a second SymFET, the Boolean logic device further comprising:

a third SymFET and a fourth SymFET, with the third and fourth SymFETs including a top gate, a back gate, an insulator, a first graphene layer, a second graphene layer, a first oxide layer, and a second oxide layer, the insulator being disposed between the first and second graphene layers, the first and second graphene layers being disposed between the first and second oxide layers, the first and second oxide layers being disposed between the top and back gates, wherein a first conductor extends between the first and fourth SymFETs and a second conductor extends between the second and third SymFETs, with the first and second conductors being coupled, the output voltage taken from the first and second conductors, wherein a clocked input voltage is supplied to the third and fourth SymFETs and a drain voltage is supplied to the back gates of the third and fourth SymFETs, wherein a first bias voltage is supplied to a back gate of the first SymFET, and a second bias voltage is supplied to a top gate of the third SymFET, wherein the input voltage is supplied to the top gate of the first SymFET, wherein outputs of the first and second SymFETs are grounded, wherein the top and back gates of the second SymFET are grounded, wherein the top gate of the fourth SymFET is coupled to the first conductor.

10. A Boolean MAJORITY gate comprising:

a first SymFET including a top gate, a back gate, an insulator, a first graphene layer, a second graphene layer, a first oxide layer, and a second oxide layer, the insulator being disposed between the first and second graphene layers, the first and second graphene layers being disposed between the first and second oxide layers, the first and second oxide layers being disposed between the top and back gates;

a second SymFET including a top gate, a back gate, an insulator, a first graphene layer, a second graphene layer, a first oxide layer, and a second oxide layer, the insulator being disposed between the first and second graphene layers, the first and second graphene layers being disposed between the first and second oxide layers, the first and second oxide layers being disposed between the top and back gates;

a third SymFET including a top gate, a back gate, an insulator, a first graphene layer, a second graphene layer, a first oxide layer, and a second oxide layer, the insulator being disposed between the first and second graphene layers, the first and second graphene layers being disposed between the first and second oxide layers, the first and second oxide layers being disposed between the top and back gates;

a first input supplying a first voltage to the first SymFET;

a second input supplying a second voltage to the second SymFET; and a third input supplying a third voltage to the third SymFET, wherein the first, second, and third SymFETs are configured to be in parallel in a circuit.

11. A Boolean MAJORITY gate of claim 8 further comprising a fourth input supplying a bias voltage to the top and back gates of the first, second, and third SymFETs.

12. A Boolean logic latch comprising:
- a first SymFET including a top gate, a back gate, an insulator, a first graphene layer, a second graphene layer, a first oxide layer, and a second oxide layer, the insulator being disposed between the first and second graphene layers, the first and second graphene layers being disposed between the first and second oxide layers, the first and second oxide layers being disposed between the top and back gates;
- a second SymFET including a top gate, a back gate, an insulator, a first graphene layer, a second graphene layer, a first oxide layer, and a second oxide layer, the insulator being disposed between the first and second graphene layers, the first and second graphene layers being disposed between the first and second oxide layers, the first and second oxide layers being disposed between the top and back gates;
- a first input supplying a first voltage to the first SymFET;
- a second input supplying a second voltage to the second SymFET; and
- a third input supplying a bias voltage to the top and back gates of the first and second SymFETs,
- wherein the first and second SymFETs are configured to be in parallel in a circuit.

13. A Boolean logic latch of claim 12 further comprising an inverter between the second input and the second SymFET.

\* \* \* \* \*